US 11,437,893 B2

(12) United States Patent
Brinkmann et al.

(10) Patent No.: US 11,437,893 B2
(45) Date of Patent: Sep. 6, 2022

(54) PLANAR-DRIVE SYSTEM, STATOR MODULE AND SENSOR MODULE

(71) Applicant: Beckhoff Automation GmbH, Verl (DE)

(72) Inventors: Rolf Brinkmann, Bad Salzuflen (DE); Lukas Bentfeld, Delbrueck (DE); Uwe Pruessmeier, Lemgo (DE)

(73) Assignee: Beckhoff Automation GmbH, Verl (DE)

( * ) Notice: Subject to any disclaimer, the term of this patent is extended or adjusted under 35 U.S.C. 154(b) by 147 days.

(21) Appl. No.: 16/897,985

(22) Filed: Jun. 10, 2020

(65) Prior Publication Data

US 2020/0303997 A1  Sep. 24, 2020

Related U.S. Application Data

(63) Continuation of application No. PCT/EP2018/085772, filed on Dec. 19, 2018.

(30) Foreign Application Priority Data

Dec. 27, 2017  (DE) .................... 10 2017 131 320.6

(51) Int. Cl.
*H02K 11/21* (2016.01)
*H02K 11/215* (2016.01)
(Continued)

(52) U.S. Cl.
CPC ....... *H02K 11/215* (2016.01); *G01R 33/0094* (2013.01); *G01R 33/0206* (2013.01);
(Continued)

(58) Field of Classification Search
CPC .............. H02K 11/215; G01R 33/0094; G01R 33/0206
See application file for complete search history.

(56) References Cited

U.S. PATENT DOCUMENTS 4,126,797 A    11/1978 Kling
4,458,227 A    7/1984 Petersen
(Continued)

FOREIGN PATENT DOCUMENTS

CN    101427449 A    5/2009
CN    101951115 A    1/2011
(Continued)

OTHER PUBLICATIONS

Written Notice to the International Preliminary Examination Authority dated Jan. 13, 2020 for International Patent Application No. PCT/EP2018/085772, 16 pages including machine translation.
(Continued)

*Primary Examiner* — Alvaro E Fortich
(74) *Attorney, Agent, or Firm* — Dorsey & Whitney LLP

(57) ABSTRACT

A planar-drive system includes a rotor and stator module with a housing, a stator assembly for driving the rotor, and a sensor module for detecting the rotor position. The sensor module has a 2D arrangement of magnetic-field sensors arranged on a carrier in first and second periodic grids, extending in first and second directions. Adjacent magnetic-field sensors are arranged at first and second distances in the first and second directions. The grids are shifted by a vector having first and second components smaller than the respective first and a second distances. The rotor has first and second magnet units, each with an arrangement of magnets with first and second periodic lengths aligned in the first and second directions. The first and second components of the vector, and a difference between the first and second distances and the respective components, are each smaller than the respective first and second periodic lengths.

20 Claims, 14 Drawing Sheets

(51) Int. Cl.
*G01R 33/00* (2006.01)
*G01R 33/02* (2006.01)
*G01R 33/07* (2006.01)
*H02K 1/20* (2006.01)

(52) U.S. Cl.
CPC .......... *G01R 33/072* (2013.01); *H02K 1/20* (2013.01); *H02K 2201/18* (2013.01)

(56) References Cited

U.S. PATENT DOCUMENTS

| | | | |
|---|---|---|---|
| 6,226,073 B1 | 5/2001 | Emoto | |
| 6,353,273 B1 | 3/2002 | Heshmat et al. | |
| 9,202,719 B2 | 12/2015 | Lu et al. | |
| 10,116,195 B2 | 10/2018 | Lu | |
| 11,038,410 B2 | 6/2021 | Brinkmann et al. | |
| 2003/0192686 A1 | 10/2003 | Hisai et al. | |
| 2006/0220478 A1 | 10/2006 | Emoto | |
| 2012/0098391 A1 | 4/2012 | Yamasaki et al. | |
| 2012/0156898 A1 | 6/2012 | Kallee | |
| 2012/0307476 A1 | 12/2012 | Masuzawa et al. | |
| 2013/0164687 A1 | 6/2013 | Binnard et al. | |
| 2013/0278087 A1* | 10/2013 | Kimiabeigi | H02K 1/2786 310/51 |
| 2014/0062236 A1 | 3/2014 | Taniguchi et al. | |
| 2014/0204358 A1 | 7/2014 | Yang et al. | |
| 2014/0285122 A1 | 9/2014 | Lu et al. | |
| 2015/0338750 A1 | 11/2015 | Yang et al. | |
| 2015/0369216 A1* | 12/2015 | Kisovec | H02K 21/24 290/55 |
| 2016/0099623 A1 | 4/2016 | Böhm et al. | |
| 2016/0161288 A1* | 6/2016 | Lu | G01D 5/145 324/207.2 |
| 2016/0241173 A1 | 8/2016 | Prüssmeier et al. | |
| 2016/0254722 A1 | 9/2016 | Yamamoto et al. | |
| 2017/0163140 A1 | 6/2017 | Lu | |
| 2017/0179805 A1 | 6/2017 | Lu | |
| 2017/0179806 A1 | 6/2017 | Lu | |
| 2018/0205304 A1 | 7/2018 | Lu | |
| 2018/0212505 A1* | 7/2018 | Ding | G03F 7/70758 |
| 2020/0304007 A1 | 9/2020 | Brinkmann et al. | |
| 2020/0304008 A1 | 9/2020 | Brinkmann et al. | |
| 2020/0304009 A1 | 9/2020 | Brinkmann et al. | |
| 2020/0304010 A1 | 9/2020 | Brinkmann et al. | |
| 2020/0321846 A1 | 10/2020 | Brinkmann et al. | |
| 2021/0091621 A1 | 3/2021 | Brinkmann et al. | |
| 2021/0091622 A1 | 3/2021 | Brinkmann et al. | |
| 2021/0184612 A1 | 6/2021 | Prüssmeier | |

FOREIGN PATENT DOCUMENTS

| | | |
|---|---|---|
| DE | 102018117981 A1 | 1/2020 |
| DE | 102019117430 A1 | 12/2020 |
| DE | 102019117431 A1 | 12/2020 |
| JP | 2005279007 A | 10/2005 |
| WO | 2009083891 A2 | 7/2009 |
| WO | 2013059934 A1 | 5/2013 |
| WO | 2015017933 A1 | 2/2015 |
| WO | 2015179962 A1 | 12/2015 |
| WO | 2015184553 A1 | 12/2015 |
| WO | 2015188281 A1 | 12/2015 |
| WO | 2017004716 A1 | 1/2017 |
| WO | 2019129547 A1 | 7/2019 |
| WO | 2019129561 A1 | 7/2019 |
| WO | 2019129562 A1 | 7/2019 |
| WO | 2019129564 A1 | 7/2019 |
| WO | 2019129566 A1 | 7/2019 |
| WO | 2019129576 A1 | 7/2019 |
| WO | 2020020605 A1 | 1/2020 |
| WO | 2020020607 A1 | 1/2020 |
| WO | 2020260566 A1 | 12/2020 |

OTHER PUBLICATIONS

International Preliminary Report on Patentability dated Jan. 4, 2020 for International Patent Application No. PCT/EP2018/085772, 41 pages including machine translation.

International Search Report and Written Opinion dated Apr. 11, 2019 for International Patent Application No. PCT/EP2018/085772, 76 pages including machine translation.

Examination Report dated Aug. 24, 2018 for German Patent Application No. 10 2017 131 320.6, 16 pages including machine translation.

Office Action dated Apr. 6, 2021 in connection with Chinese patent application No. 201880089829.X, 8 pages including English translation.

* cited by examiner

PLANAR-DRIVE SYSTEM, STATOR MODULE AND SENSOR MODULE

CROSS-REFERENCE TO RELATED APPLICATIONS

The present application is a continuation of International Patent Application PCT/EP2018/085772, filed Dec. 19, 2018, entitled PLANAR DRIVE SYSTEM, STATOR MODULE AND SENSOR MODULE, which claims priority of German patent application DE 10 2017 131 320.6, filed Dec. 27, 2017, entitled PLANARANTRIEBSSYSTEM, STATORMODUL UND SENSORMODUL, each of which is incorporated by reference herein, in the entirety and for all purposes.

TECHNICAL FIELD

The present invention relates to a planar-drive system for the two- or three-dimensional drive of a rotor, to a stator module for such a planar-drive system and to a sensor module for detecting a position of the rotor in the planar-drive system.

BACKGROUND

Planar-drive systems may be used, inter alia, in automation technology, in particular in production engineering, handling technology and process engineering. Planar-drive systems may be used to move or position a movable element of a facility or machine in two or three linearly independent directions. Planar-drive systems may comprise a permanently energized electromagnetic planar motor having a planar stator and a rotor movable on the planar stator in two or three directions.

In a permanently energized electromagnetic planar motor, a driving force is exerted upon the rotor by current flowing through conductor loops interacting magnetically with drive magnets of a magnet arrangement formed at the rotor.

A sensor module may be used to determine a position of the rotor above the planar stator and to vary the current flow in the current-carrying conductor loops on the basis of the determined positions of the rotor.

The sensor module may have magnetic-field sensors by which a permanent magnetic field of the rotor may be detected. Depending on the position of the magnetic-field sensors and the rotor, individual magnetic-field sensors will then measure a magnetic field and others will not. Considering the signals of all magnetic-field sensors, conclusions may be drawn with regard to the position of the rotor. Different arrangements of the magnetic-field sensors within the sensor module may be provided.

Publication WO 2015/017933 A1 discloses various possibilities of arranging the magnetic-field sensors of a sensor module for the determining a position of a rotor. For this purpose the magnetic-field sensors are arranged in a periodic grid. Grid constants of the periodic grid may be selected depending on the magnetic arrangements of the rotor to enable position detection of the rotor. The magnetic-field sensors may be integrated into stator modules, wherein the stator modules may be set up to provide driving for the rotor in addition to position detection. However, the gaps between the magnetic-field sensors, as disclosed in publication WO 2015/017933 A1, are relatively small, so that electrical connecting cables and in particular heat conduction elements, which are also necessary for the operation of the stator module, cannot easily be arranged between the magnetic-field sensors to dissipate the waste heat generated during operation of the driving.

SUMMARY

The invention provides an improved sensor module. The invention further provides a stator module comprising such an improved sensor module and a planar-drive system having such an improved sensor module.

According to a first aspect, a planar-drive system comprises a rotor and a stator module. The stator module comprises a stator-module housing, a stator assembly for an electrical drive of the rotor and a sensor module for detecting a position of the rotor. The rotor may be driven over a flat stator surface of the stator assembly at least in a first direction and in a second direction which are linearly independent. It may additionally be provided that the rotor may be driven in a third direction perpendicular to the first or second direction. The sensor module has a carrier and a two-dimensional arrangement of magnetic-field sensors. The magnetic-field sensors are arranged on the carrier. The two-dimensional arrangement of magnetic-field sensors has a first sub-arrangement of magnetic-field sensors and a second sub-arrangement of magnetic-field sensors. The magnetic-field sensors of the first sub-arrangement are arranged in a first periodic grid. The magnetic-field sensors of the first periodic grid are arranged along the first direction and along the second direction. Adjacent magnetic-field sensors of the first sub-arrangement are in the first direction arranged at a first distance with regard to each other. Adjacent magnetic-field sensors of the first sub-arrangement are in the second direction arranged at a second distance with regard to each other. The magnetic-field sensors of the second sub-arrangement are arranged in a second periodic grid. The magnetic-field sensors in the second periodic grid are arranged along the first direction and along the second direction. Adjacent magnetic-field sensors of the second sub-arrangement are arranged at a first distance with regard to each other in the first direction and at a second distance with regard to each other in the second direction. The first sub-arrangement and the second sub-arrangement are arranged shifted relative to each other by a vector. The vector comprises a first component in the first direction and a second component in the second direction. The first component is smaller than the first distance. The second component is smaller than the second distance.

The rotor comprises a first magnet unit having a first periodic arrangement of magnets with a first periodic length. Furthermore, the rotor also comprises a second magnet unit with a second periodic arrangement of magnets having a second periodic length. The first periodic arrangement of magnets is periodic in the first direction. The second arrangement of magnets is periodic in the second direction. During operation of the planar-drive system, the first magnet unit is oriented in the first direction and the second magnet unit is oriented in the second direction. The first component is smaller than the first periodic length. A difference between the first distance and the first component is also smaller than the first periodic length. The second component is smaller than the second periodic length. A difference between the second distance and the second component is smaller than the second periodic length, as well.

In order to detect the position of the rotor in the planar-drive system, a sufficient number of magnetic-field sensors are provided inside of the sensor module. This allows for always providing a sufficient number of magnetic-field sensors in the vicinity of the rotor in order to determine the exact position of the rotor. On the other hand, the measured data of the magnetic-field sensors must be evaluated, which is why the smallest number of magnetic-field sensors should be provided, as this may reduce the required computing power. With the arrangement of the magnetic-field sensors of the position detection unit in two periodic grids, wherein the grids are identically constructed and shifted with regard to each other, sufficient magnetic-field sensors are provided on the one hand in order to detect the position of the rotor. On the other hand, the number of magnetic-field sensors is less than previously known from the prior art so that the computing power required for evaluation when detecting the position of the rotor may be reduced.

According to a second aspect, a stator module for a planar-drive system comprises a stator-module housing and a stator assembly for an electrical drive of a rotor and a sensor module. The rotor may be driven over a flat stator surface of the stator assembly at least in a first direction and in a second direction. The sensor module comprises a carrier and a two-dimensional arrangement of magnetic-field sensors. The magnetic-field sensors are arranged on the carrier. The two-dimensional arrangement of magnetic-field sensors has a first sub-arrangement of magnetic-field sensors and a second sub-arrangement of magnetic-field sensors. The magnetic-field sensors of the first sub-arrangement are arranged in a first periodic grid. Within the first periodic grid the magnetic-field sensors are arranged along a first direction and along a second direction. Adjacent magnetic-field sensors of the first sub-arrangement in the first direction are arranged at a first distance from one another. Adjacent magnetic-field sensors of the first sub-arrangement are arranged at a second distance from each other in the second direction. The magnetic-field sensors of the second sub-arrangement are arranged in a second periodic grid. The magnetic-field sensors are arranged in the second periodic grid along the first direction and along the second direction. Adjacent magnetic-field sensors of the second sub-arrangement are arranged at a first distance from each other in the first direction and at a second distance from each other in the second direction. The first sub-arrangement and the second sub-arrangement are arranged shifted relative to each other by a vector, this vector having a first component in one direction and a second component in the second direction. The first component is smaller than the first distance and the second component is smaller than the second distance. The arrangement of the magnetic-field sensors within the stator module thus corresponds to the arrangement of the magnetic-field sensors of the stator module of the planar-drive system.

According to a third aspect, a sensor module for detecting a position of a rotor in a planar-drive system comprises a carrier and a two-dimensional arrangement of magnetic-field sensors. The magnetic-field sensors are arranged on the carrier. The two-dimensional arrangement of magnetic-field sensors comprises a first sub-arrangement of magnetic-field sensors and a second sub-arrangement of magnetic-field sensors. The magnetic-field sensors of the first sub-arrangement are arranged in a first periodic grid in a first direction and a second direction. Adjacent magnetic-field sensors of the first sub-arrangement are arranged in the first direction at a first distance from each other. Adjacent magnetic-field sensors of the first sub-arrangement are arranged at a second distance from one another in the second direction. The magnetic-field sensors of the second sub-arrangement are arranged in a second periodic grid, the magnetic-field sensors being arranged in the second periodic grid in the first direction and in the second direction. Adjacent magnetic-field sensors of the second sub-arrangement are arranged at a first distance from each other in the first direction and at a second distance from each other in the second direction. The first sub-arrangement and the second sub-arrangement are shifted relative to each other by a vector, the vector comprising a first component in the first direction and a second component in the second direction. The first component is smaller than the first distance and the second component is smaller than the second distance.

EXAMPLES

In an embodiment, the first periodic length is a product of a first rational number and the first distance, and the second periodic length is a product of a second rational number and the second distance. The first rational number and the second rational number are from an interval between 0.5 and 1.

In an embodiment, the numerator of the first rational number and/or the numerator of the second rational number is odd.

In an embodiment, the first rational number is five sixths. Furthermore, the second rational number is five sixths. This provides, on the one hand, a sufficient number of magnetic-field sensors in order to detect the position of the magnet units and, on the other hand, the lowest number of magnetic-field sensors.

It may be provided that the stator assembly comprises energizable conductor strips. The energizable conductor strips may be energized in such a way that magnetic fields generated by energizing the conductor strips interact with the magnet units of the rotor and thus drive the rotor. The conductor strips may be arranged along the first direction or along the second direction. Two adjacent conductor strips arranged along the first direction comprise a first conductor-strip distance in the second direction, the first conductor-strip distance being defined as the distance between two central lines of the conductor strips aligned along the first direction. With these conductor strips the rotor may be driven in the first direction. Two adjacent conductor strips arranged along the second direction have a second conductor-strip distance in the first direction, the second conductor-strip distance being defined as the distance between two central lines of the conductor strips aligned along the second direction. With these conductor strips, the rotor may be driven in the second direction. Conductor strips may be provided that are aligned along the first direction as well as along the second direction. In this case, the rotor may be driven in both the first and second direction. The first distance or, respectively, the second distance may be thirty-six fifths of the first or second conductor-strip distance. This relation between the conductor-strip distance and the distance of the magnetic-field sensors results in a stator assembly that is well suited for driving the rotor as well as for determining the position of the rotor.

In another embodiment, the first component is between 0.35 and 0.65 of the first distance. The second component is between 0.35 and 0.65 of the second distance.

Such a shift of the first grid of the first sub-arrangement and of the second grid of the second sub-arrangement relative to each other allows for a comprehensive covering of the sensor module with magnetic-field sensors. The magnetic-field sensors of the second grid are arranged in a central area between the magnetic-field sensors of the first grid.

In an embodiment, the first component corresponds to half the first distance and the second component to half the second distance. If both components correspond to the respective half distance, the magnetic-field sensors of the second sub-arrangement are arranged exactly in the middle between the magnetic-field sensors of the first sub-arrangement. This further improves the position detection of the rotor. Furthermore, by arranging of the magnetic-field sensors of the second grid exactly in the middle between the magnetic-field sensors of the first grid, the space between the magnetic-field sensors is maximized. In this intermediate space, heat-conducting elements may be provided more easily.

In an embodiment, the first distance and the second distance are equal. This additionally means that the first periodic length of the first magnet unit of the rotor is identical to the second periodic length of the second magnet unit of the rotor. This allows for a regular arrangement of the magnetic-field sensors in order to further improve position detection.

In another embodiment, the first direction and the second direction are perpendicular to each other. This allows the planar-drive system to be set up in such a way that the rotor may be moved in both an x-direction and a y-direction, wherein the x-direction may correspond to the first direction and the y-direction to the second direction. Furthermore, the rotor may simultaneously be driven in the x- and y-directions. Furthermore, it is to an extent possible, as well, to drive the rotor in a third direction perpendicular to the first direction and the second direction. If the magnet units of the rotor have a rectangular embodiment, a compact arrangement of the magnet unit within the rotor may be achieved.

In another embodiment, the stator surface is a parallelogram. A length of a first parallelogram side of the stator surface is a first integer multiple of the first distance, a length of a second parallelogram side of the stator surface is a second integer multiple of the second distance. The first side of the parallelogram is parallel to the first direction. The second parallelogram side is parallel to the second direction.

As a result, a plurality of stator modules may be arranged directly adjacent to one another, wherein the magnetic-field sensors of the first sub-arrangements of the stator modules each form a first sub-arrangement of magnetic-field sensors over all stator modules and the second sub-arrangements of the magnetic-field sensors of the stator modules form a second sub-arrangement of magnetic-field sensors over all stator modules. The grid of the first sub-arrangement and the grid of the second sub-arrangement may thus be continued by attaching a next stator module directly adjacent to a stator module. This provides a simple possibility of constructing a modular planar-drive system consisting of several stator modules, wherein the magnetic-field sensors of the sensor modules form a continuous grid over the entire surface of the stator modules.

This considerably simplifies the position detection of the rotor in a modular planar-drive system.

In an embodiment, the stator module is rectangular. If the stator module is rectangular, it is even easier to arrange several stator modules adjacent to each other in a modular fashion. In another embodiment, the stator module is square.

In an embodiment, the first integer multiple and the second integer multiple are identical. This means that each stator module has an identical number of magnetic-field sensors in the first direction and in the second direction within the grid of the first sub-arrangement and within the grid of the second sub-arrangement.

In another embodiment, the carrier is arranged in such a way that a first magnetic-field sensor of the first sub-arrangement is arranged below a first corner region of the stator surface. The first corner region of the stator surface is thereby arranged at an intersection of the first parallelogram side and the second parallelogram side. The first magnetic-field sensor is in the first direction arranged at a quarter of the first distance from the second parallelogram side. A magnetic-field-sensor plane containing the magnetic-field sensors intersects a first plane containing the second parallelogram side which is perpendicular to the magnetic-field-sensor plane. The fact that the first magnetic-field sensor is in the first direction arranged at a quarter of the first distance from the second parallelogram side is intended to mean that a vector in parallel to the first direction from the first magnetic-field sensor to the intersection line of the magnetic-field-sensor plane and the first plane has a length of a quarter of the first distance. In the second direction, the first magnetic-field sensor is located a quarter of the second distance from the first parallelogram side. The magnetic-field-sensor plane intersects a second plane which contains the first parallelogram side and which is perpendicular to the magnetic-field-sensor plane. The fact that the first magnetic-field sensor is in the second direction positioned at a quarter of the second distance from the first parallelogram side is intended to mean that a vector parallel to the second direction from the first magnetic-field sensor to the intersection line of the magnetic-field-sensor plane and the second plane has a length of a quarter of the second distance.

A second magnetic-field sensor of the second sub-arrangement is arranged below a second corner region of the stator surface opposite to the first corner region. The second corner region of the stator surface is thereby arranged at an intersection of a third parallelogram side and a fourth parallelogram side. The second magnetic-field sensor is in the first direction arranged at a quarter of the first distance from the fourth parallelogram side of the stator module, with the fourth parallelogram side facing the second parallelogram side. The magnetic-field-sensor plane intersects a third plane which contains the fourth parallelogram side and which is perpendicular to the magnetic-field-sensor plane. The fact that the second magnetic-field sensor is in the first direction located at a quarter of the first distance from the fourth parallelogram side is to mean that a vector parallel to the first direction from the second magnetic-field sensor to the intersection line of the magnetic-field-sensor plane and the third plane has a length of a quarter of the first distance. The second magnetic-field sensor is in the second direction arranged at a quarter of the second distance from the third parallelogram side of the stator module, the third parallelogram side being opposite to the first parallelogram side. The magnetic-field-sensor plane intersects a fourth plane which contains the third parallelogram side and which is perpendicular to the magnetic-field-sensor plane. The fact that the second magnetic-field sensor is in the second direction arranged at a quarter of the second distance from the third parallelogram side is intended to mean that a vector parallel to the second direction from the second magnetic-field sensor to the intersection line of the magnetic-field-sensor plane and the fourth plane has a length of a quarter of the second distance.

Thus the magnetic-field sensors of the first sub-arrangement and of the second sub-arrangement form a point-symmetrical arrangement of magnetic-field sensors. This allows the stator module to be rotated by 180°, which does not change the arrangement of the magnetic-field sensors, since the rotation causes the magnetic-field sensors of the first sub-arrangement to assume the positions of the magnetic-field sensors of the second sub-arrangement prior to rotation, and vice versa. This allows for providing stator modules which may be used even more flexibly.

In an embodiment, the first magnet unit has a first extension in the first direction corresponding to the first periodic length. In addition, the first magnet unit has a second extension in the second direction, which corresponds to twice the second periodic length. The second magnet unit has a third extension in the second direction which corresponds to the second periodic length. Furthermore, the second magnet unit has a fourth extension in the first direction corresponding to twice the first periodic length.

In another embodiment, the rotor comprises a third magnet unit and a fourth magnet unit. The third magnet unit comprises a third periodic arrangement of magnets which is periodic in the first direction and the periodic length of which corresponds to the first periodic length. The third magnet unit is oriented in the first direction during operation of the planar-drive system. The first magnet unit and the third magnet unit are distanced by a first magnet-unit distance. The fourth magnet unit comprises a fourth periodic arrangement of magnets which is periodic in the second direction and the periodic length of which corresponds to the second periodic length. The fourth magnet unit is oriented in the second direction during operation of the planar-drive system. The second magnet unit and the fourth magnet unit are arranged at a second magnet unit distance from each other. The third magnet unit has the first extension in the first direction. The third magnet unit has the second extension in the second direction. The fourth magnet unit has the third extension in the second direction. The fourth magnet unit has the fourth extension in the first direction.

The magnet units are arranged in a square. The first magnet unit is arranged in a first corner of the square. The second magnet unit is located in a second corner of the square. The third magnet unit is arranged in a third corner of the square. The fourth magnet unit is arranged in a fourth corner of the square. The first corner is located opposite to the third corner.

This provides a compact rotor whose position may be determined by the sensor module.

In an embodiment, the first magnet unit distance corresponds to the first periodic length or thirteen twelfths of the first periodic length. In another embodiment, the second magnet unit distance corresponds to the second periodic length or thirteen-twelfths of the second periodic length.

In an embodiment, the first magnet unit and the second magnet unit are rectangular. In another embodiment, the third and fourth magnet units are rectangular, as well.

If the first periodic length is five sixths of the first distance and the second periodic length is five sixths of the second distance, and two mutually parallel magnet units are provided within the rotor, which are each arranged at a distance of the first periodic length or thirteen twelfths of the first periodic length or, respectively, the second periodic length or thirteen twelfths of the second periodic length with regard to one another, a good position detection of the rotor is allowed for.

In an embodiment, the carrier is arranged inside of the stator-module housing.

In an embodiment, the first component is between 0.35 and 0.65 of the first distance. The second component is between 0.35 and 0.65 of the second distance. In an embodiment, the first component is half of the first distance and the second component is half of the second distance. In an embodiment, the first direction and the second direction are perpendicular to each other.

In another embodiment, the stator surface is a parallelogram. A length of a first parallelogram side of the stator surface is a first integer multiple of the first distance. A length of a second parallelogram side of the stator surface is a second integer multiple of the second distance.

In another embodiment, the stator module is rectangular. In another embodiment, the stator module is square. In another embodiment, the first integer multiple and the second integer multiple are identical.

In an embodiment, the carrier in the stator module is arranged in such a way that a first magnetic-field sensor of the first sub-arrangement is arranged below a first corner region of the stator surface. The first corner region is thereby arranged at an intersection of the first and second parallelogram side. The first magnetic-field sensor is arranged in the first direction at a quarter of the first distance from the second parallelogram side of the stator surface. The first magnetic-field sensor is positioned at a quarter of the second distance from the first parallelogram side of the stator surface in the second direction. A second magnetic-field sensor of the second sub-arrangement is arranged below a second corner region of the stator surface. The second corner region is located at an intersection of a third and a fourth parallelogram side of the stator surface. The second magnetic-field sensor is located in the first direction at a quarter of the first distance from the fourth parallelogram side of the stator module. The fourth parallelogram side is opposite to the second parallelogram side. The second magnetic-field sensor is located in the second direction at a quarter of the second distance from the third parallelogram side of the stator module. The third parallelogram side is opposite to the first parallelogram side.

Thus, the magnetic-field sensors of the stator module are arranged in the stator module in such a way that the position of the magnetic-field sensors is invariant when the stator module is rotated about a vertical axis by 180°, the vertical axis running through the center of the stator module. This enables a simpler modular design of the planar-drive system, since the stator modules may be arranged in series in the original orientation as well as an orientation rotated by 180° and the periodic grid of the magnetic-field sensors is steadily continued.

In an embodiment, the first distance and the second distance are equal.

In an embodiment, the magnetic-field sensors are Hall sensors and in particular two-dimensional or three-dimensional Hall sensors, in the following also referred to as 2D or 3D Hall sensors. Hall sensors, 2D Hall sensors and 3D Hall sensors represent a simple way of implementing magnetic-field sensors.

In an embodiment, the carrier has a circuit board, in particular a printed-circuit board. This allows for implementing simple manufacturing techniques for providing the sensor module, which contains the carrier with the magnetic-field sensors arranged on it.

In an embodiment, the stator assembly is arranged on an upper side of the stator-module housing. The carrier is arranged below the stator assembly in the stator-module housing and has a through-hole. The stator-module housing has a heat-conducting structure that is designed to dissipate heat from the stator assembly to a bottom side of the stator-module housing opposite to the stator surface. The heat-conducting structure is guided from the stator assembly to the bottom side of the stator-module housing via the through-hole. The through-hole is adjacent to four magnetic-field sensors, two of which belong to the first sub-arrangement and two to the second sub-arrangement.

The stator assembly should be arranged as close as practical to the upper side in order to effectively drive the rotor. On the one hand, the sensor module should be arranged at a certain distance from the upper side to avoid signal saturation of the magnetic-field sensors. On the other hand, the sensor module should not be placed too far away from the upper side in order to be able to measure a signal. For this reason, it may be necessary to dissipate the heat generated during operation of the stator assembly, which is caused by the high currents required for driving, away from the stator assembly. This may be carried out by heat-conducting elements which are led through the carrier of the sensor module via through-holes. The inventive arrangement of the magnetic-field sensors in two sub-arrangements makes it possible to provide relatively large through-holes, wherein the thermal conductivity may be improved. An intermediate space between four magnetic-field sensors may be used to carry out a heat-conducting structure. This intermediate space is located between two magnetic-field sensors of the first sub-arrangement and two magnetic-field sensors of the second sub-arrangement.

In another embodiment, the carrier has a plurality of through-holes and a plurality of heat-conducting elements guided through the through-holes. The through-holes are each adjacent to four magnetic-field sensors, two of which are assigned to the first sub-arrangement and two to the second sub-arrangement. In this way, the heat conduction from the stator assembly to the bottom side may be further improved.

In an embodiment, one or a plurality of openings are square and/or pentagonal. In another embodiment, the carrier has an inner area and an outer area. The outer area is arranged in a ring around the inner area. The through-hole or through-holes are arranged in the outer area. The inner area covers a maximum of 35 percent of the area of the sensor module. In such an arrangement, several heat-conducting elements may be guided through the outer ring-shaped area via through-holes. This allows for conducting the waste heat from the stator assembly almost completely away from the stator assembly to the bottom side of the housing.

In an embodiment, the arrangement of magnetic-field sensors comprises exactly two sub-arrangements of magnetic-field sensors.

It may be provided that the stator assembly has energizable conductor strips. The energizable conductor strips may be energized in such a way that magnetic fields induced by the current flowing through the conductor strips interact with the magnet units of the rotor and, as a result, drive the rotor. The conductor strips may be arranged along the first direction or, respectively, along the second direction. Two adjacent conductor strips arranged along the first direction have a first conductor-strip distance in the second direction, the first conductor-strip distance being defined as the distance between two central lines of the conductor strips oriented along the first direction. Two adjacent conductor strips arranged along the second direction have a second conductor-strip distance in the first direction, the second conductor-strip distance being defined as the distance between two central lines of the conductor strips aligned along the second direction. The first distance and the second distance may be thirty-six fifths of the first or, respectively, of second conductor-strip distance. This relation between the conductor-strip distance and the distance between the magnetic-field sensors results in a stator assembly which is well suited to drive the rotor and to determine the position of the rotor.

The further embodiments of the stator module may also be used in the stator module of the planar-drive system.

In an embodiment the first component is between 0.35 and 0.65 of the first distance and the second component is between 0.35 and 0.65 of the second distance.

In an embodiment, the first component corresponds to half the first distance and the second component corresponds to half the second distance.

In an embodiment, the first direction and the second direction are perpendicular to each other. In an embodiment, the sensor module is rectangular, in particular square. In another embodiment, the first distance and the second distance are equal. In an embodiment of the sensor module, the magnetic-field sensors are Hall sensors, particularly 3D Hall sensors. In another embodiment of the sensor module, the carrier has a circuit board, especially a printed-circuit board. In another embodiment of the sensor module, the arrangement of magnetic-field sensors comprises exactly two sub-arrangements of magnetic-field sensors.

In an embodiment, the carrier has a through-opening, four magnetic-field sensors adjoining the through-opening, two of the four magnetic-field sensors being assigned to the first sub-arrangement and two of the four magnetic-field sensors being assigned to the second sub-arrangement. In an embodiment, the carrier has a plurality of through-holes, four magnetic-field sensors adjoining the through-holes, two of the four magnetic-field sensors adjoining one of the through-holes being assigned to the first sub-arrangement and two of the four magnetic-field sensors adjoining this through-hole being assigned to the second sub-arrangement.

In an embodiment, the through-holes are square and/or pentagonal. In an embodiment, the through-openings are arranged in an outer region of the carrier, the outer region being arranged annularly around an inner region of the carrier, and the outer region of the carrier comprising at least 50 percent, in particular at least 75 percent, in particular at least 85 percent of an area of the carrier.

BRIEF DESCRIPTION OF THE DRAWINGS

The invention will be discussed in more detail below on the basis of embodiment examples and with reference to the accompanying figures. Here, in a schematic illustration in each case.

The present invention relates to further developments of the planar-drive systems disclosed in publications WO 2013/059934 A1, WO 2015/017933 A1, WO 2015/179962 A1, WO 2015/184553 A1, WO 2015/188281 A1 and WO 2017/

004716 A1. The disclosure content of the above-mentioned publications is incorporated by reference herein, in the entirety and as subject matter for all purposes.

Figure 1:
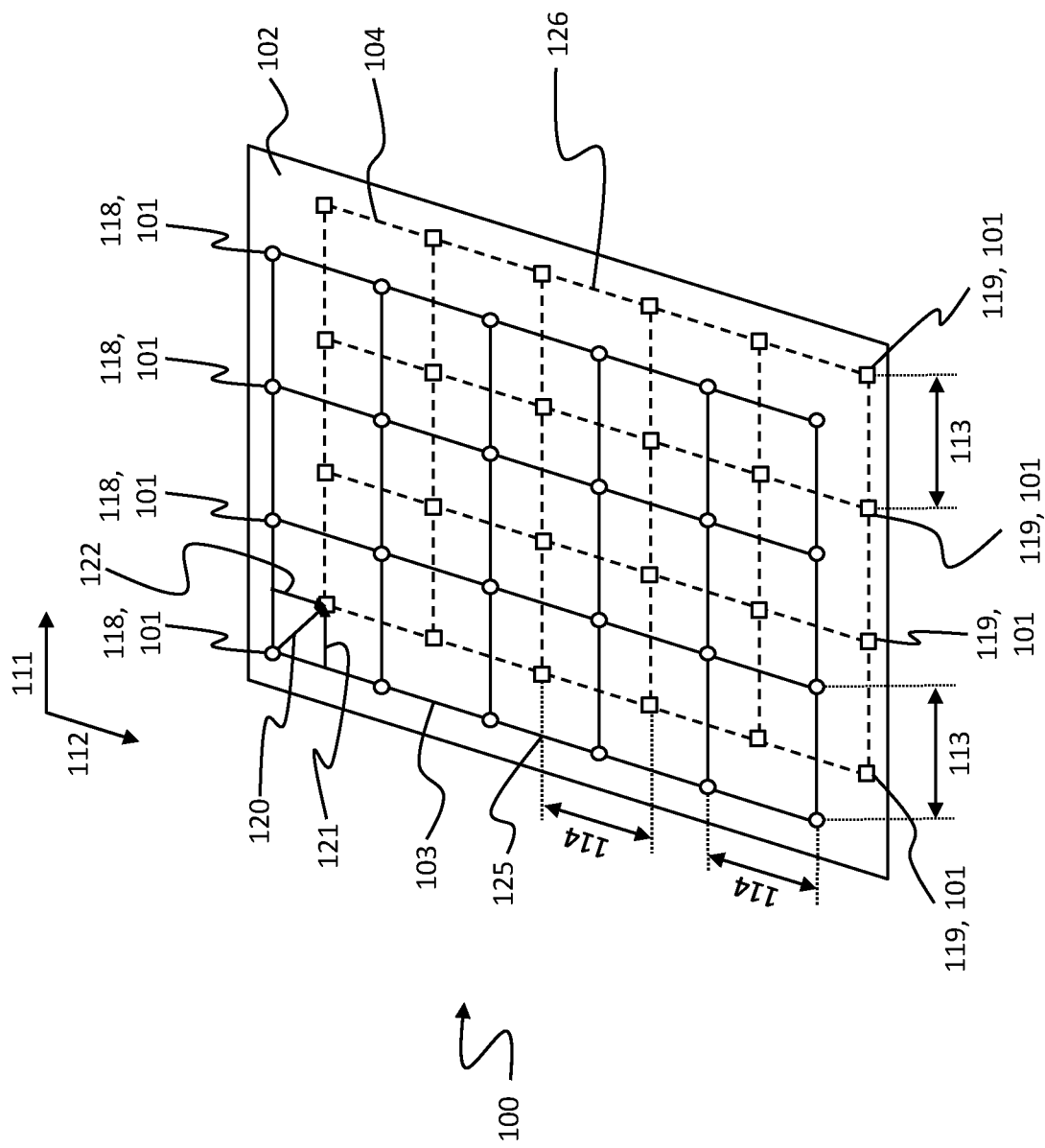
FIG. 1 shows a first embodiment example of a sensor module.

FIG. 1 shows a top view of a sensor module 100 for detecting a position of a rotor in a planar-drive system. The sensor module 100 is parallelogram-shaped and has a two-dimensional arrangement of magnetic-field sensors 101 on a carrier 102. The magnetic-field sensors 101 are thus arranged on the carrier 102. The two-dimensional arrangement of the magnetic-field sensors 101 has a first sub-arrangement 125 of magnetic-field sensors 101 and a second sub-arrangement 126 of magnetic-field sensors 101. The first sub-arrangement 125 of magnetic-field sensors 101 is arranged in a first periodic grid 103, the second sub-arrangement 126 of magnetic-field sensors 101 is arranged in a second periodic grid 104. The magnetic-field sensors 101 of the first sub-arrangement 125 in the first grid 103 are indicated by round symbols, while the magnetic-field sensors 101 of the second sub-arrangement 126 of the second grid 104 are indicated by square symbols.

Insofar as the magnetic-field sensors 101 are in the following discussed in general terms, reference sign 101 is used. If the magnetic-field sensors 101 are described in connection with the first sub-arrangement 125 or, respectively, the first grid 103 and/or the second sub-arrangement 126 or, respectively, the second grid 104, reference sign 118 is used in the following for first magnetic-field sensors 118 of the first sub-arrangement 125 or, respectively, of the first grid 103 and reference sign 119 is used for second magnetic-field sensors 119 of the second sub-arrangement 126 or, respectively, of the second grid 104.

The first magnetic-field sensors 118 are connected with continuous lines to illustrate the grid structure of the first grid 103. The second magnetic-field sensors 119 are connected with dashed lines to illustrate the grid structure of the second grid 104. The first magnetic-field sensors 118 and the second magnetic-field sensors 119 may be identical, the round and square symbols are only meant to symbolize the positions of the magnetic-field sensors 101 belonging to the respective sub-arrangements 125, 126. The first magnetic-field sensors 118 have a first distance 113 with regard to each other in a first direction 111. The first magnetic-field sensors 118 have a second distance 114 with regard to each other in a second direction 112. The second magnetic-field sensors 119 are in the first direction 111 also arranged at a first distance 113 with regard to each other and in the second direction 112 at a second distance 114 with regard to each other. The first grid 103 and the second grid 104 are identically constructed and shifted relative to each other by a vector 120, the vector 120 having a first component 121 in the first direction 111 and a second component 122 in the second direction 112. The value of the first component 121 is smaller than the first distance 113 and the magnitude of the second component 122 is smaller than the second distance 114. As a result, the second magnetic-field sensors 119 of the second grid 104 and the first magnetic-field sensors 118 of the first grid 103 are each shifted relative to each other, a second magnetic-field sensor 119 being arranged between four first magnetic-field sensors 118 at least in a partial region of the sensor module 100. The first grid 103 represents a first sub-arrangement 125 of an arrangement of magnetic-field sensors 101, while the second grid 104 represents a second sub-arrangement 126 of magnetic-field sensors 101. Both sub-arrangements 125, 126 each comprise an identical number of first and second magnetic-field sensors 118, 119.

The first component 121 may be between 0.35 and 0.65 of the first distance 113. The second component 122 may be between 0.35 and 0.65 of the second distance 114.

The first component 121 may correspond to half of the first distance 113 and the second component 122 may correspond to half of the second distance 114.

An angle between the first direction 111 and the second direction 112 may be between 0 and 180 degrees. In particular, the angle between the first direction 111 and the second direction 112 may be between 60 degrees and 120 degrees.

In the first direction 111, the first grid 103 has four first magnetic-field sensors 118 arranged side by side at a first distance 113, and the second grid 104 has four second magnetic-field sensors 119 arranged side by side at a first distance 113. In the second direction 112, the first grid 103 has six first magnetic-field sensors 118 arranged next to each other at a second distance 114, likewise the second grid 104 has six second magnetic-field sensors 119 arranged next to each other at a second distance 114. However, other numbers of magnetic-field sensors 101 may also be provided in the two directions 111, 112.

The carrier 102 is flat, so that the magnetic-field sensors 101 are arranged in a plane, i.e. in a two-dimensional arrangement.

The magnetic-field sensors 101 may be embodied as Hall sensors. In particular, the magnetic-field sensors 101 may be embodied as 2D or 3D Hall sensors, wherein 3D Hall sensors measure the magnetic-field components in three linearly independent spatial directions. These spatial directions may in particular include the first direction 111 and the second direction 112 as well as a third direction perpendicular to the first direction 111 and to the second direction 112.

The carrier 102 may be designed as a circuit board and/or a printed-circuit board. Thereby, the carrier 102 may be provided in a simple manner.

The arrangement of magnetic-field sensors 101 may comprise exactly two sub-arrangements 125, 126 of the two grids 103, 104.

Figure 2:
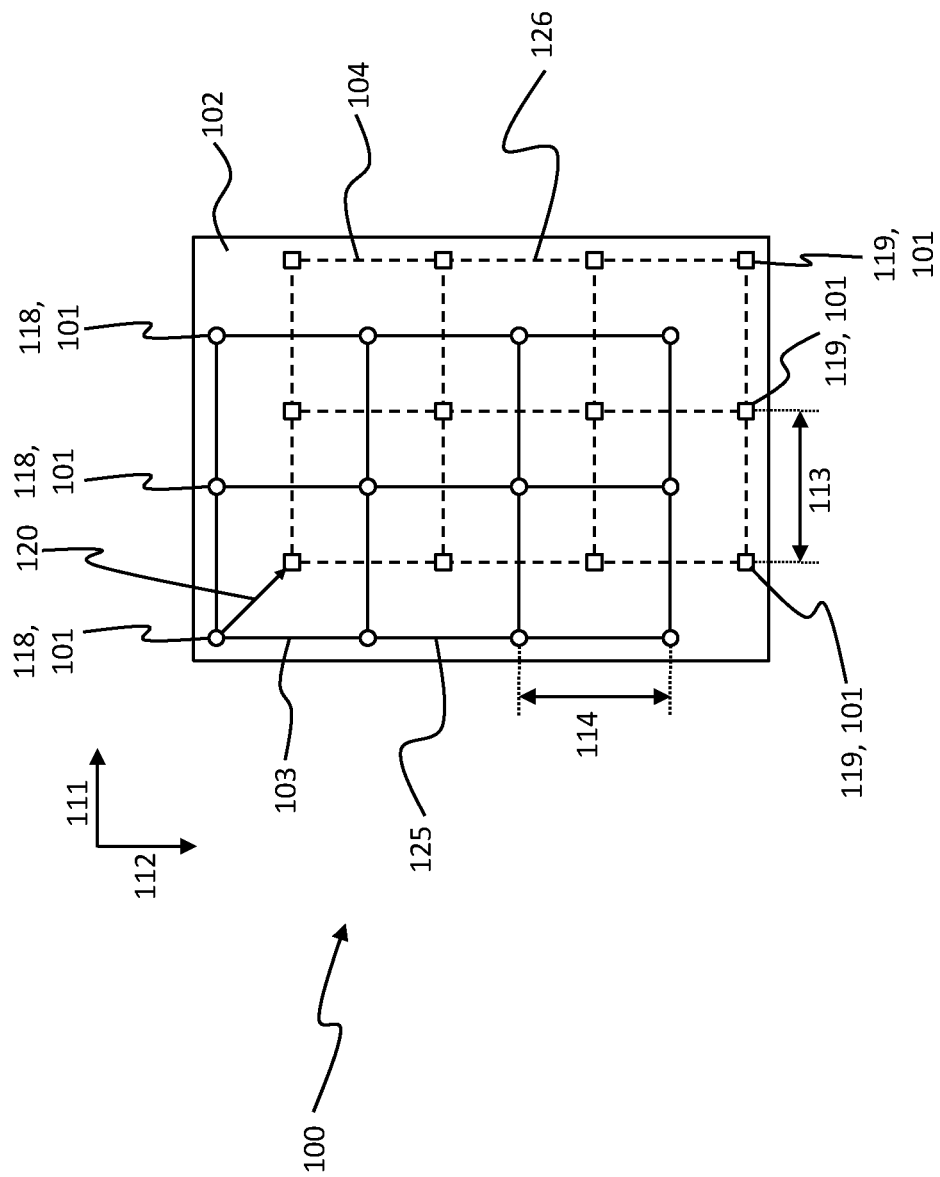
FIG. 2 shows a second embodiment example of a sensor module.

FIG. 2 shows a top view of a further sensor module 100 which, unless differences are described in the following, corresponds to the sensor module of FIG. 1. The first direction 111 and the second direction 112 are perpendicular to each other. Furthermore, the sensor module 100 is rectangular. In the first direction 111, three first magnetic-field sensors 118 positioned next to one another at a first distance 113 and three second magnetic-field sensors 119 positioned next to one another at a first distance 113 are arranged. In the second direction 112, four first magnetic-field sensors 118 positioned next to one another at a second distance 114 and four second magnetic-field sensors 119 positioned next to one another at a second distance 114 are arranged. The first magnetic-field sensors 118 are again indicated by round symbols, the second magnetic-field sensors 119 are again indicated by square symbols. The first distance 113 between two adjacent magnetic-field sensors 101 in the first direction 111 and the second distance 114 between two magnetic-field sensors 101 in the second direction 112 are identical. In an embodiment, it is also possible that the sensor module 100 is square and respectively comprises three first magnetic-field sensors 118 and three second magnetic-field sensors 119 in the first direction 111 and in the second direction 112.

Figure 3:
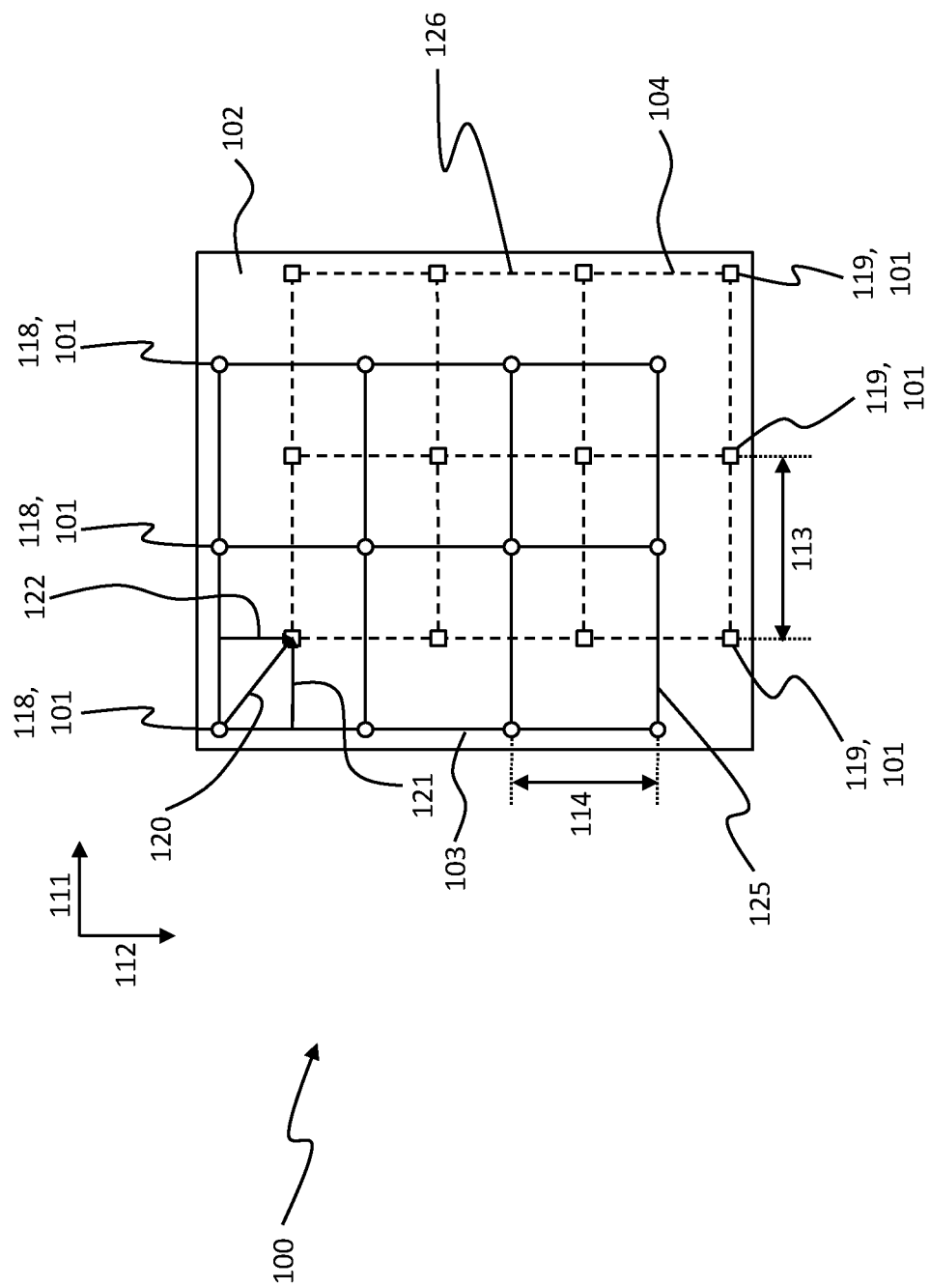
FIG. 3 shows a third embodiment example of a sensor module.

FIG. 3 shows a top view of another embodiment example of a sensor module 100 which, unless differences are described in the following, corresponds to the sensor module of FIG. 2. The first distance 113 in the first direction 111 is larger than the second distance 114 in the second direction 112. The sensor module 100 is square. In the first direction 111, three first magnetic-field sensors 118 positioned next to each other at the first distance 113 and three second magnetic-field sensors 119 positioned next to each other at the first distance 113 are arranged. In the second direction 112, four first magnetic-field sensors 118 positioned next to one another at a second distance 114 and four second magnetic-field sensors 119 positioned next to one another at a second distance 114 are arranged. An arrangement of magnetic-field sensors 101 within the sensor module 100 as shown in FIG. 3 may be used if the position determination of a rotor in the second direction 112 is to be more precise than the position determination of the rotor in the first direction 111.

In addition, as shown in FIG. 3, the vector 120 may in all embodiment examples of the arrangement of magnetic-field sensors 101 be embodied in such a way that the first component 121 corresponds to half of the first distance 113, while the second component 122 corresponds to half of the second distance 114. Then, at least in a partial area of the sensor module 100, the second magnetic-field sensors 119 are each arranged in the middle between four first magnetic-field sensors 118.

Figure 4:
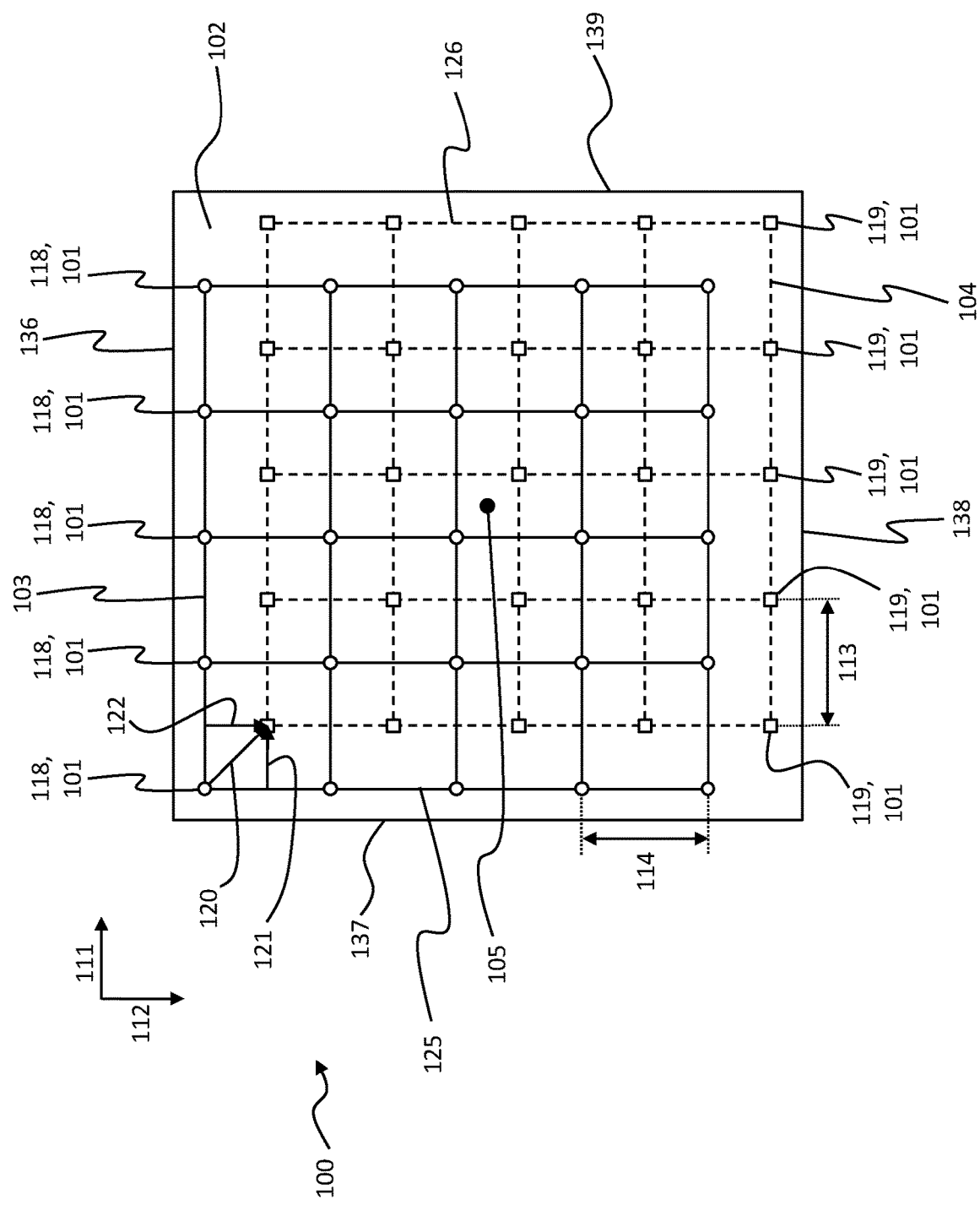
FIG. 4 shows a fourth embodiment example of a sensor module.

FIG. 4 shows a top view of another embodiment example of a sensor module 100 which, unless differences are described in the following, corresponds to the sensor module of FIG. 2. The carrier 102 of the sensor module is square. In the first direction 111, five first magnetic-field sensors 118 are positioned next to one another at a first distance 113 and five second magnetic-field sensors 119 are positioned next to one another at a first distance 113. In the second direction 112, as well, five first magnetic-field sensors 118 are positioned next to one another at a second distance 114 and five second magnetic-field sensors 119 are positioned next to one another at a second distance 114. The vector 120 is embodied in such a way that the first component 121 corresponds to half the first distance 113, while the second component 122 corresponds to half the second distance 114. Thus, at least in a central region of the sensor module 100, the second magnetic-field sensors 119 are arranged centrally between the first magnetic-field sensors 118 and the first magnetic-field sensors 118 are arranged centrally between the second magnetic-field sensors 119.

In total, the sensor module 100 has an arrangement of magnetic-field sensors 101 consisting of twenty-five first magnetic-field sensors 118 of a first sub-arrangement 125 of the magnetic-field sensors 101 and twenty-five second magnetic-field sensors 119 of a second sub-arrangement 126 of the magnetic-field sensors 101.

The carrier 102 has a first side 136 which is arranged in parallel to the first direction 111. A second side 137 of the carrier 102 is arranged in parallel to the second direction 112. A third side 138 of the carrier 102 is opposite to the first side 136. A fourth side 139 of the carrier 102 is opposite to the second side.

The arrangement of the magnetic-field sensors 101 has a center 105 and is point-symmetrical with respect to the center 105. This means that if the arrangement of the magnetic-field sensors 101 is rotated by 180° about the vertical axis at the center 105, the arrangement of the magnetic-field sensors 101 does not change. After the 180° rotation, the first magnetic-field sensors 118 assume the positions of the second magnetic-field sensors 119 before the rotation, and vice versa.

Figure 5:
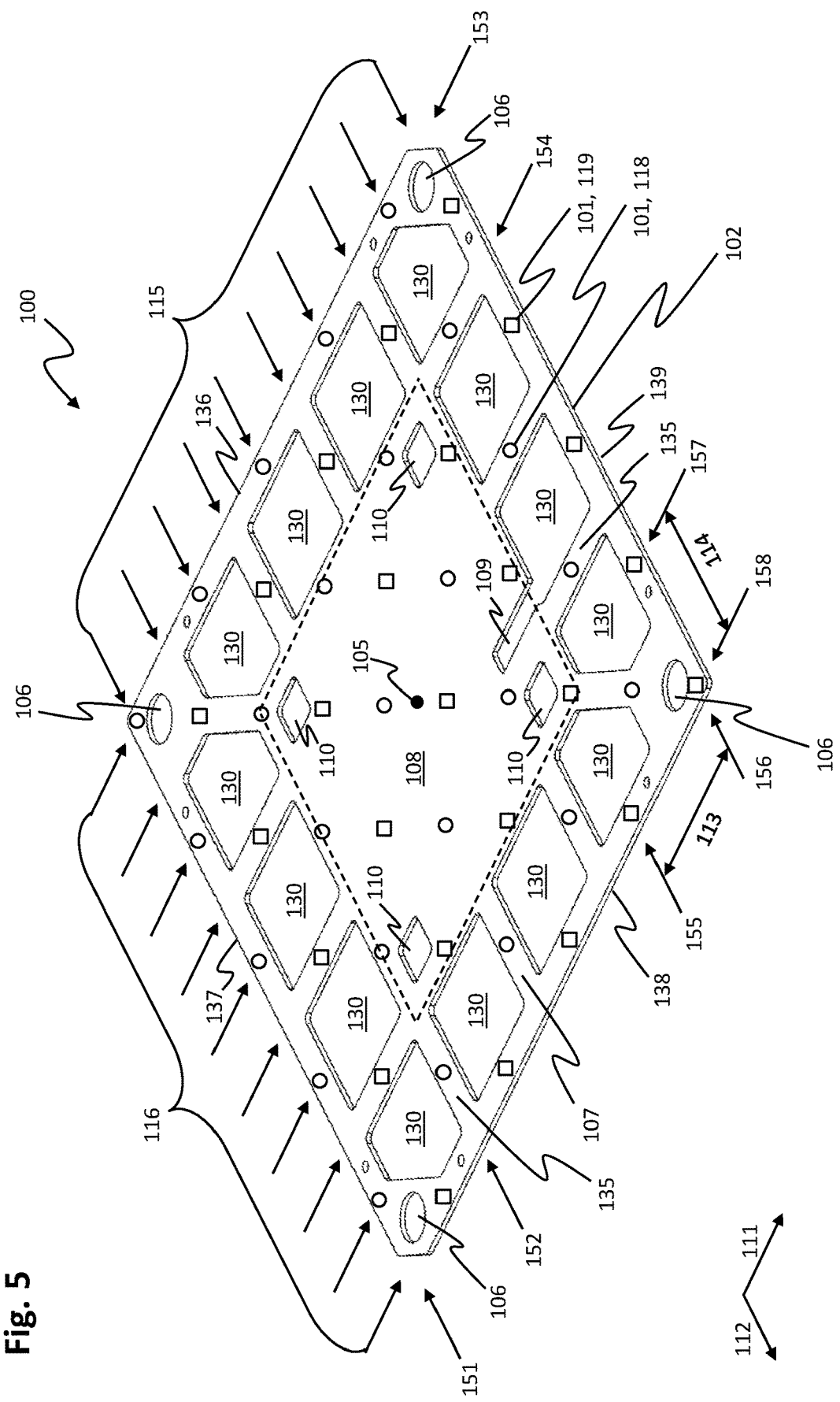
FIG. 5 shows a fifth embodiment example of a sensor module.

FIG. 5 shows a further embodiment example of a sensor module 100 which, unless differences are described below, corresponds to the sensor module of FIG. 4. The carrier 102 is divided up into an outer area 107 and an inner area 108. The inner area 108 has a square shape and is located in the center of the carrier 102. The outer area 107 is arranged in a ring around the inner area 108. The outer area 107 may also be referred to as the edge area. In the outer area 107, the carrier comprises 102 through-holes 130 and alignment holes 106. With the alignment holes 106, the carrier 102 and thus the sensor module 100 may be aligned within a stator module. The through-holes 130 are each arranged between four magnetic-field sensors 101 and thereby positioned between two first magnetic-field sensors 118 and two second magnetic-field sensors. The first magnetic-field sensors 118 are again indicated by round symbols, the second magnetic-field sensors 119 are again represented by square symbols.

The through-openings 130 are partly square and partly pentagonal. Parallel to a first side 136 of the carrier 102, an alignment hole 106 is formed in the outer area 107 along the first direction 111 seen from the second side 137 in the direction of the fourth side 139 of the carrier 102, adjacent to the alignment hole 106 a pentagonal passage opening 130, adjacent thereto two square passage openings 130, again a pentagonal passage opening 130 and again an alignment hole 106. As shown, the alignment hole 106 adjoining the fourth side 139 is thereby arranged next to a flattened corner of the pentagonal through-opening 130. The arrangement described with reference to the first side 136 is repeated on the third side 138 of the carrier 102 in the outer area 107 along the first direction 111 seen from the fourth side 139 towards the second side 137 of the carrier 102. In parallel to a second side 137 of the carrier 102, an alignment hole 106 is formed in the outer region 107 along the second direction 112 as seen from the first side 136 in the direction of the third side 138 of the carrier 102, adjacent to the alignment hole 106 a pentagonal through-opening 130, adjacent thereto two square through-openings 130, again a pentagonal through-opening 130 and again an alignment hole 106. As shown, the alignment hole 106 adjacent to the third side 138 is thereby arranged next to a flattened corner of the pentagonal passageway 130. The arrangement described in relation to the second side 137 is repeated on the fourth side 139 of the carrier 102 in the outer area 107 along the second direction 112 seen from the third side 138 in the direction of the first side 136 of the carrier 102. Between each of the through-holes 130, a web 135 with a first magnetic-field sensor 118 or a second magnetic-field sensor 119 is arranged. The carrier 102 thus has a total of eight square openings 130 and six pentagonal openings 130. Instead of the fourteen openings 130, a smaller number of openings 130, in particular only one opening 130, may be provided. In an alternative embodiment, more and/or differently shaped openings 130 may be provided. Inside a stator module, i.e. when the carrier 102 is installed in a stator module, the through-openings 130 may be used for the passage of heat-conducting elements. A through-hole 130 has a slot-shaped extension 109, which widens said through-hole 130 into the inner area 108. This slot-shaped widening 109 may be used to carry out electrical contacting. In addition, further through-openings 110 are provided in the inner area 108, which may be used to carry out electrical contacting.

The through-openings 130 on the first side 136 of the carrier 102 are each opposite to a web 135 at the third side 138 of the carrier 102. The webs 135 at the third side 138 are centrally opposite to the through-openings 130 on the first side 136. The through-openings 130 on the third side 138 of the carrier 102 are each opposite to a web 135 at the first side 136 of the carrier 102. The webs 135 on the first side 136 are centrally opposite to the through-openings 130 at the third side 138. A second magnetic-field sensor 119 is arranged on the webs 135 on the first side 136, while a first magnetic-field sensor 118 is located on each of the webs 135 adjacent to the third side 138. The through-holes 130 at the second side 137 of the carrier 102 are each opposite to a web 135 at the fourth side 139 of the carrier 102. The webs 135 at the fourth side 139 are centrally opposite to the through-openings 130 at the second side 137. The through-openings 130 on the fourth side 139 of the carrier 102 are each opposite to a web 135 on the second side 137 of the carrier 102. A second magnetic-field sensor 119 is thereby located on the webs 135 at the second side 137, while a first magnetic-field sensor 118 is located on the webs 135 adjacent to the fourth side 139.

An area of the outer area 107 is more than 50 percent of an area of the entire carrier 102, in particular more than 75 percent, in particular more than 85 percent.

The magnetic-field sensors 101 are arranged in the first grid 103 and in the second grid 104 in five columns 115 and five rows 116, respectively. The position detection module 100 thus comprises a total of ten columns 115 and ten rows 116 of magnetic-field sensors 101, the columns 115 being aligned in parallel to the second direction 112 and the rows 116 being aligned in parallel to the first direction 111. At the first side 136 of the carrier 102, the through-openings 130 are arranged between a first row 153 of the first grid 103 with first magnetic-field sensors 118 shown in FIG. 4 and a second row 154 of the first grid 103 with first magnetic-field sensors 118. For clarity's sake, the first grid 103 and the second grid 104 are shown in FIGS. 1-4. In this regard, reference is made to the description in conjunction with FIG. 4. At the second side 137 of the carrier 102, the through-openings 130 are located between a first column 151 of the first grid 103 with first magnetic-field sensors 118 and a second column 152 of the first grid 103 with first magnetic-field sensors 118. At the third side 138 of the carrier 102, the through-openings 130 are arranged between a fourth row 157 of the second grid 104 comprising second magnetic-field sensors 119 and a fifth row 158 of the second grid 104 comprising second magnetic-field sensors 119. At the fourth side 139 of the carrier 102, the through-openings 130 are arranged between a fourth column 155 of the second grid 104 comprising second magnetic-field sensors 119 and a fifth column 156 of the second grid 104 comprising second magnetic-field sensors 119. Thus, the through-openings 130 are arranged in the annular outer area 107 surrounding the inner area 108. It may be provided that the through-openings 130 are arranged exclusively in the annular outer area 107 surrounding the inner area 108.

If the first grid 103 comprising first magnetic-field sensors 118 and the second grid 104 with comprising magnetic-field sensors 119 have a number of magnetic-field sensors 101 in the first direction 111 and/or the second direction 112 different than five, it may be provided that at the third side 138 of the carrier 102 the through-openings 130 are arranged between a penultimate row of the second grid 104 comprising second magnetic-field sensors 119 and a last row of the second grid 104 comprising second magnetic-field sensors 119, while at the fourth side 139 of the carrier 102 the through-openings 130 are arranged between a penultimate column of the second grid 104 comprising second magnetic-field sensors 119 and a last column of the second grid 104 comprising second magnetic-field sensors 119.

Alternatively, the webs 135 may be positioned non-centrally opposite to the through-openings 130.

Figure 6:
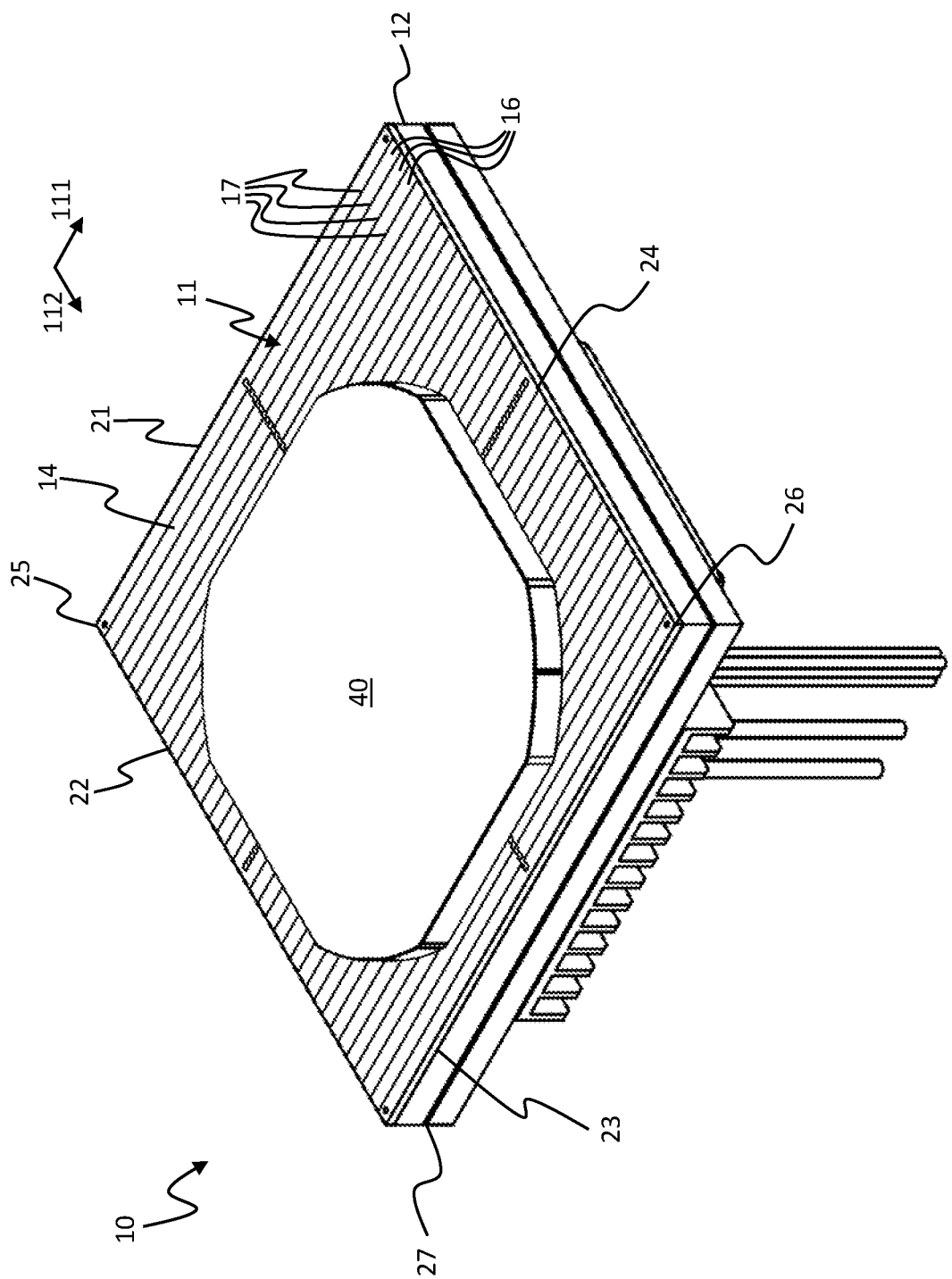
FIG. 6 shows an isometric view of a stator module with a rotor.

FIG. 6 shows an isometric view of a stator module 10 having a flat stator surface 11. The flat stator surface 11 is arranged at the upper side of a stator-module housing 12. Above the stator surface 11, a rotor 40 is arranged. The stator surface 11 is part of a stator assembly 14 for an electrical drive of the rotor 40. The stator assembly 14 with the stator surface 11 may be designed as a printed-circuit board. The stator surface 11 is square having a first side 21, a second side 22, a third side 23 and a fourth side 24, wherein the first side 21 is opposite to the third side 23 and the second side 22 is opposite to the fourth side 24. The stator surface 11 has a first corner area 25 between the first side 21 and the second side 22. Furthermore, the stator surface 11 has a second corner region 26 which is opposite to the first corner region 25, i.e. is located between the third side 23 and the fourth side 24. The sides 21, 22, 23, 24 form edges of the stator surface 11 and delimit the stator surface 11.

The rotor 40 may be driven above the stator surface 11 at least in the first direction 111 and in the second direction 112. The stator surface 11 has a plurality of conductor strips 16, which are aligned along the first direction 111. The conductor strips 16 are energizable and may be energized in such a way that the rotor 40 is driven. Between the conductor strips 16, a space 17 between the conductor strips, by which the conductor strips 16 are electrically insulated from each other, is arranged. Two adjacent conductor strips 16 may have a first conductor-strip distance in the second direction 112 of five thirty-sixths of the second distance, the first conductor-strip distance being defined as the distance between two central lines of the conductor strips oriented along the first direction. Below the stator surface 11, a further arrangement of conductor strips may be provided in which the conductor strips are aligned along the second direction 112. The central lines of these conductor strips may be arranged at a distance of five thirty-sixth of the first distance.

The stator-module housing 12 has a sectional plane 27. A sensor module may be located within the stator-module housing 12 at the level of the sectional plane 27.

Figure 7:
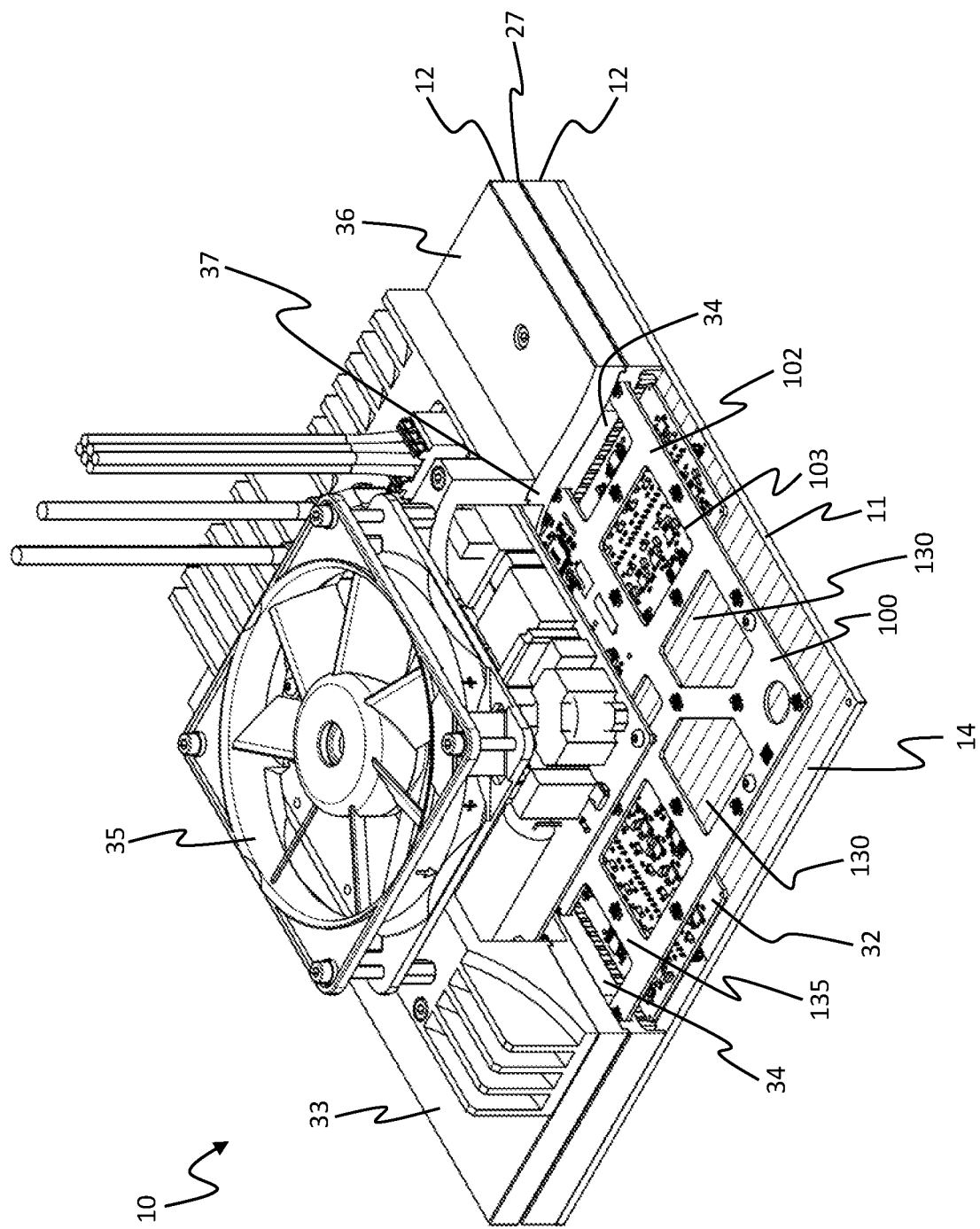
FIG. 7 shows an isometric partial section through a stator module.

FIG. 7 shows another isometric view of the square stator module 10 of FIG. 6, rotated by 180° relative to FIG. 6 about an axis formed along the first direction 111, in which the housing 12 is partially cut open so that an interior of the stator module 10 becomes visible. The stator surface 11 is accordingly arranged at the bottom in FIG. 7. The further elements of the stator module 10 are arranged above the stator surface 11. Directly above the stator assembly 14 is a power module 32, which supplies the stator assembly 14 comprising the stator surface 11 with electrical power. Above the power module 32, at the level of the sectional plane 27, a sensor module 100 is arranged, which corresponds to the sensor module 100 in FIG. 5. On this sensor module 100 which has a carrier 102, magnetic-field sensors are arranged in the direction of the stator surface 11, as described in FIGS. 4 and 5. Furthermore, the sensor module 100 has through-holes 130, wherein heat-conducting elements 34 are guided to a bottom side 33 of the housing 12 via the through-holes 130. The heat-conducting elements 34 are designed to conduct waste heat generated during operation of the power module 32 and the stator assembly 14 to the bottom side 33 of the stator-module housing 12. For this purpose, the heat-conducting elements 34 are in thermal contact with the stator assembly 14, e.g. by the heat-conducting elements 34 resting against the stator assembly 14 or being thermally contacted by a thermal paste arranged between the heat-conducting elements 34 and the stator assembly 14. In addition, the heat-conducting elements 34 are in thermal contact with the bottom side 33 of the stator housing 12, which may also be established, for example, by direct contact of the heat-conducting elements 34 with the bottom side 33 or by a thermal paste arranged between the heat-conducting elements 34 and the bottom side 33. The heat-conducting elements 34 thus form a thermally conductive connection between the stator assembly 14 and the bottom side 33 of the stator housing 12. A fan 35 is arranged on the bottom side 33, which may be used for further cooling. In addition, electrical contacts for the power module 32 may be guided through the through-holes 130.

The heat-conducting elements 34 may be embodied in one material piece and/or integrally with the stator-module housing 12. The heat-conducting elements 34 may comprise aluminum or be made of aluminum. The stator-module housing 12 may comprise aluminum or be made of aluminum.

By guiding the heat-conducting elements 34 through the openings 130, the heat-conducting structures 34 are arranged in a marginal area 36 of the housing 12, whereby a central area 37 of the housing remains free of the heat-conducting structures. The webs 135 of the carrier 102 of the sensor module 100 are each arranged between the heat-conducting elements 34.

Instead of the sensor module of FIG. 5, one of the sensor modules of FIGS. 1 to 4 may also be provided inside of the stator-module housing 12. The stator surface 11 may then, in analogy to the sensor module, be square, rectangular or parallelogram-shaped.

The first side of the stator surface 11 may have a length which is an integer multiple, in this case five times the first distance 113. The second side of the stator surface 11 may have a length which is an integer multiple, in this case five times the second distance 115.

Figure 8:
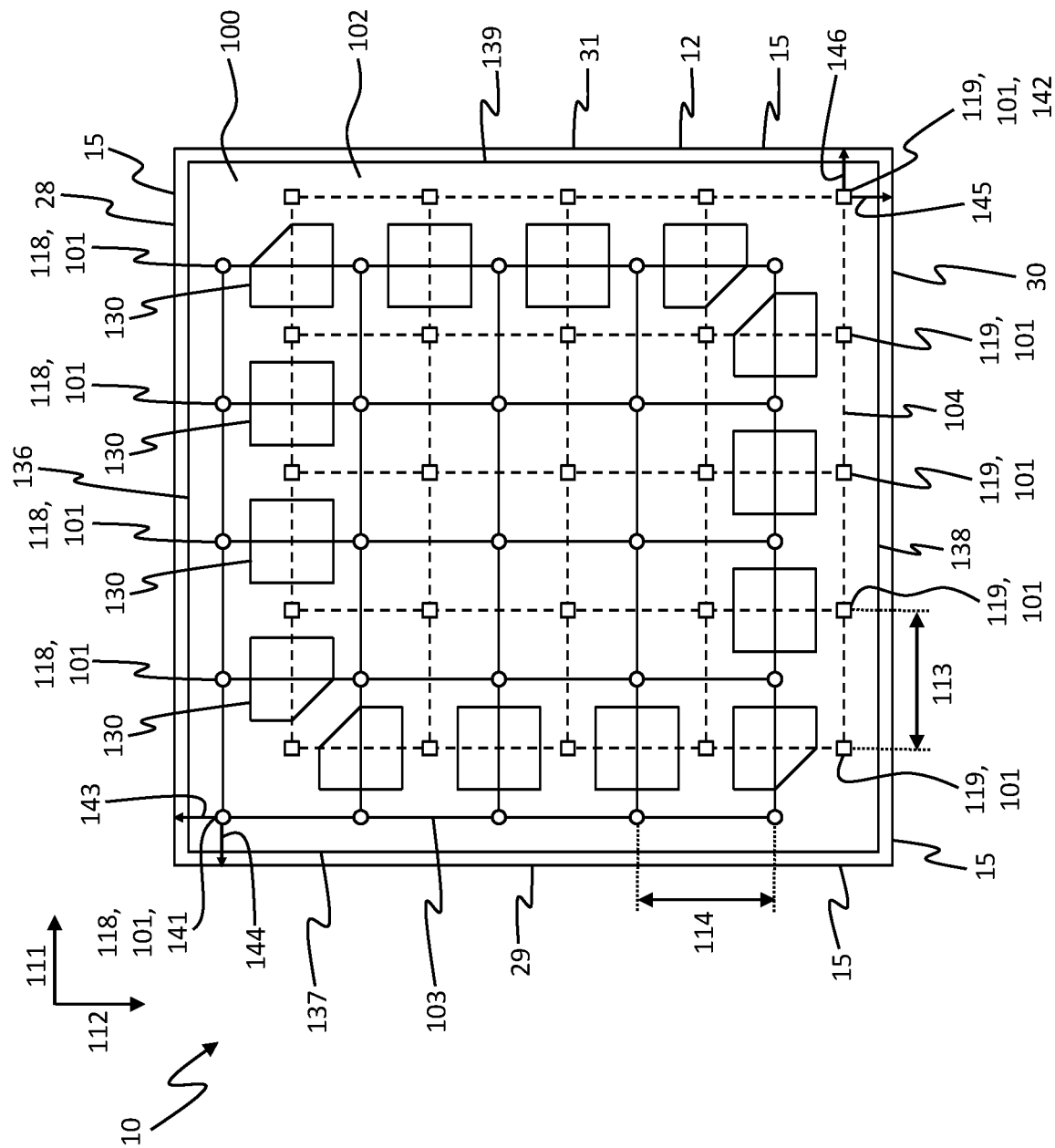
FIG. 8 shows a sectional view of a stator module.

FIG. 8 shows a simplified schematic depiction of a sectional view through the stator-module housing 12 at the sectional plane 27 of FIG. 6. On this plane, the sensor module 100 comprising the magnetic-field sensors 101 is arranged on the carrier 102 inside of the stator-module housing 12. A first vertical projection 28 faces the first side 136 of the carrier 102. A second vertical projection 29 faces the second side 137 of the carrier 102. A third vertical projection 30 faces the third side 138 of the carrier 102. A fourth vertical projection 31 faces the fourth side 139 of the carrier 102. The first to fourth vertical projections 28, 29, 30, 31 are vertical projections of the sides 21, 22, 23, 24 of the stator surface 11 shown in FIG. 6 into a magnetic-field-sensor plane, the magnetic-field-sensor plane extending through the magnetic-field sensors 101.

The stator-module housing 12 and the carrier 102 have a square embodiment. The first side 136 of the carrier 102 faces the first projection 28 of the first side 21 of the stator surface 11. The second side 137 of the carrier 102 faces the second projection 29 of the second side 22 of the stator surface 11. A third side 138 of the carrier 102 faces the third projection 30 of the third side 23 of the stator surface 11. A fourth side 139 of the carrier 102 faces the fourth projection 31 of the fourth side 24 of the stator surface 11. The outer edges 15 of the stator-module housing 12 may in this context be arranged vertically below the four sides 21, 22, 23, 24 of the stator surface 11, as shown in FIG. 6. Alternatively, the stator-module housing 12 may also have smaller dimensions, in which case the stator surface 11 protrudes over the stator-module housing 12.

A first corner magnetic-field sensor 141 of the first magnetic-field sensors 118 is arranged under the first corner area 25 of the stator surface 11 shown in FIG. 6 and assigned to the first grid 103. The first corner magnetic-field sensor 141 is arranged at an offset from the first side 21 of the stator surface 11 in the second direction 112 by a quarter of the second distance 114. This means that a first vector 143 parallel to the second direction 112 has a length of one quarter of the second distance 114 from the first corner magnetic-field sensor 141 to the first vertical projection 28. The first corner magnetic-field sensor 141 is arranged at an offset from the second side 22 of the stator surface 11 in the first direction 111 by a quarter of the first distance 113. This means that a second vector 144 parallel to the first direction 111 has a length of one quarter of the first distance 113 from the first corner magnetic-field sensor 141 to the second perpendicular projection 29. Below the second corner region 26 of the stator surface 11 shown in FIG. 6, a second corner magnetic-field sensor 142 of the second magnetic-field sensors 119 is arranged, which is assigned to the second grid 104. The second corner magnetic-field sensor 142 is arranged at an offset from the third side 23 of the stator surface 11 in the second direction 112 by a quarter of the second distance 114. This means that a third vector 145 parallel to the second direction 112 has a length of one quarter of the second distance 114 from the second magnetic-field sensor 142 to the third perpendicular projection 30. The second corner magnetic-field sensor 142 is arranged at an offset from the fourth side 24 of the stator surface 11 in the first direction 111 by a quarter of the first distance 113. This means that a fourth vector 146 parallel to the first direction 111 has a length of one quarter of the first distance 113 from the second corner magnetic-field sensor 142 to the fourth perpendicular projection 31.

The four vertical projections 28, 29, 30, 31 may coincide with side faces 15 of the stator-module housing 12, as shown in FIG. 8. However, the side faces 15 may also be offset inwardly if the stator-module housing 12 is smaller than the stator surface.

By arranging the first corner magnetic-field sensor 141 below the first corner 25 and the second corner magnetic-field sensor 142 below the second corner 26 at the distances of one-fourth of the first distance 113 and one-fourth of the second distance 114, respectively, with respect to the four vertical projections 28, 29, 30, 31 of the four sides 21, 22, 23, 24 of the stator surface 11, the first grid 103 and the second grid 104 are aligned inside the stator-module housing 12 in such a way that the stator-module housing may be rotated by 180° without changing the positions of the magnetic-field sensors 101 in total. The 180° rotation moves the first magnetic-field sensors 118 to the positions of the second magnetic-field sensors 119 and vice versa. This makes the stator module 10 more flexible in its application.

The stator module 10 shown in FIG. 8 is square. However, the distances of the first corner magnetic-field sensor 141 or the second corner magnetic-field sensor 142 to the four vertical projections 28, 29, 30, 31 may also be provided for rectangular or parallelogram-shaped stator surfaces.

Figure 9:
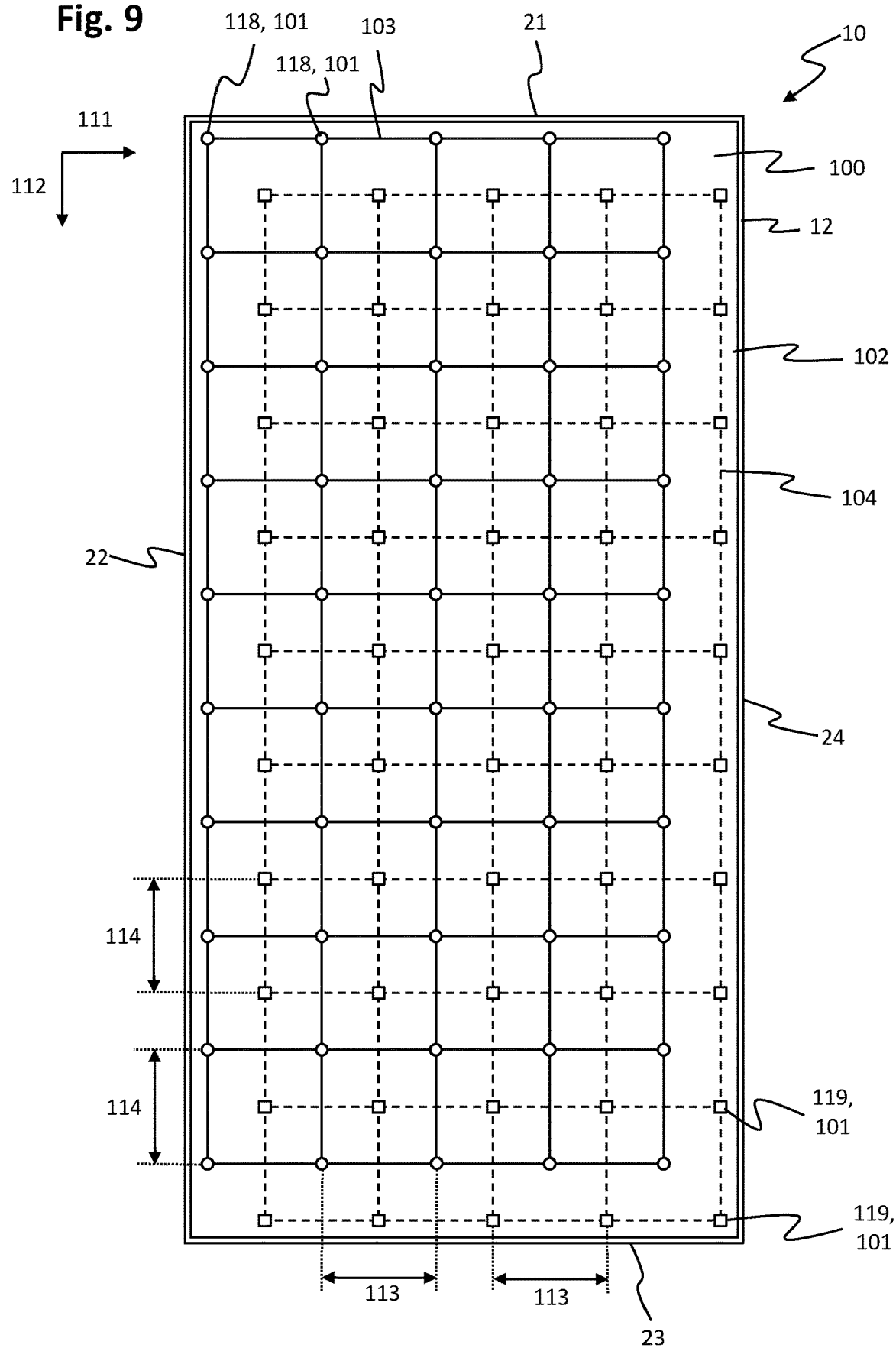
FIG. 9 shows another sectional view of a stator module.

FIG. 9 shows a simplified schematic depiction of a cross-section through a stator module 10 which, unless differences are described below, corresponds to the stator module of FIG. 8. The length of the first side 21 of the stator surface corresponds to five times the first distance 113 between two adjacent magnetic-field sensors 101 of the first grid 103 or the second grid 104 in the first direction 111. The length of the second side 22 of the stator surface corresponds to ten times the second distance 114 between two adjacent magnetic-field sensors 101 of the first grid 103 or the second grid 104 in the second direction 112. The magnetic-field sensors 101 are, in turn, arranged in such a way that a plurality of stator modules 10 may be lined up. Individual stator modules 10 may also be rotated by 180° without changing the arrangement of the magnetic-field sensors 101.

Instead of five times the first distance 113 or, respectively, ten times the second distance 114, other integer multiples of the two distances 113, 114 may be provided for the length of the sides of the stator module 10.

A stator module 10 as shown in FIG. 9 may e.g. be used if a further distance in the second direction 112 is to be covered in a planar-drive system. In this case, it is not necessary to line up two stator modules as shown in FIG. 8, but one stator module may be used as shown in FIG. 9.

Figure 10:
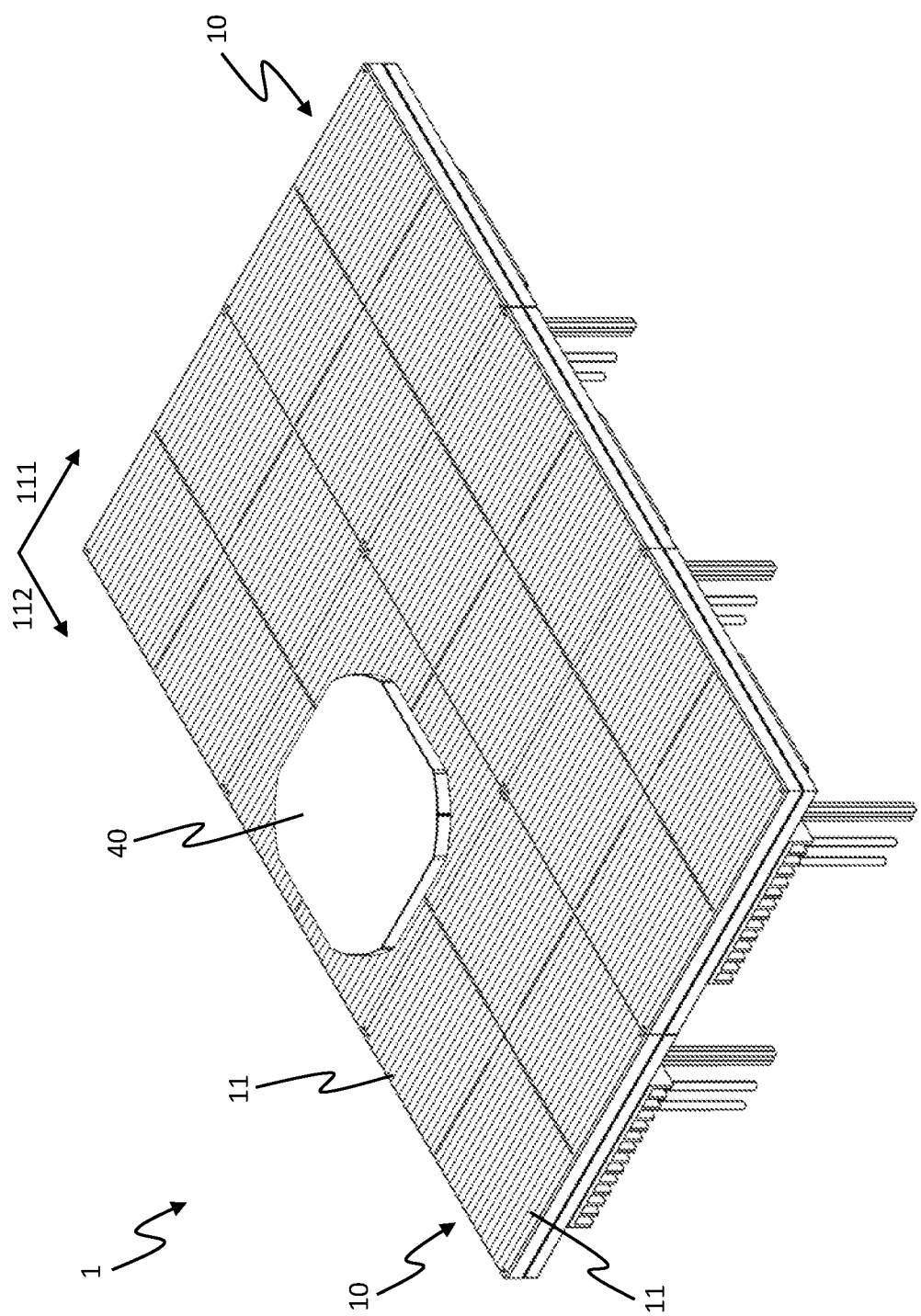
FIG. 10 shows an isometric view of several stator modules having a rotor.

FIG. 10 shows a planar-drive system 1, consisting of a plurality of stator modules 10, which are configured as shown in FIGS. 6 to 8, and a rotor 40 which may be driven above the stator surfaces 11 at least in the first direction 111 as well as in the second direction 112. The first grid and the second grid of the arrangements of magnetic-field sensors of the sensor modules of the stator modules 10 continue over the entire arrangement of the stator modules 10. Further stator modules 10 and several rotors 40 may also be provided. Instead of two adjacent stator modules 10, a stator module as shown in FIG. 9 may be provided, as well. This particularly makes sense if long distances have to be covered in one of the two directions 111, 112. Stator modules 10 with far more than ten magnetic-field sensors in one of the two directions 111, 112 may be provided, as well.

By configuring the stator modules 10 as shown in FIGS. 6 to 8, with the first corner magnetic-field sensor and the second corner magnetic-field sensor having the distances described of a quarter of the first distance or, respectively, the second distance to the projections of the stator surface 11 on the magnetic-field-sensor plane, the first grid and the second grid continue within the stator modules 10 and a periodic arrangement of the magnetic-field sensors over the side s of the stator modules 10 is created. During position detection, magnetic-field sensors of two or more stator modules 10 may then be used.

Figure 11:
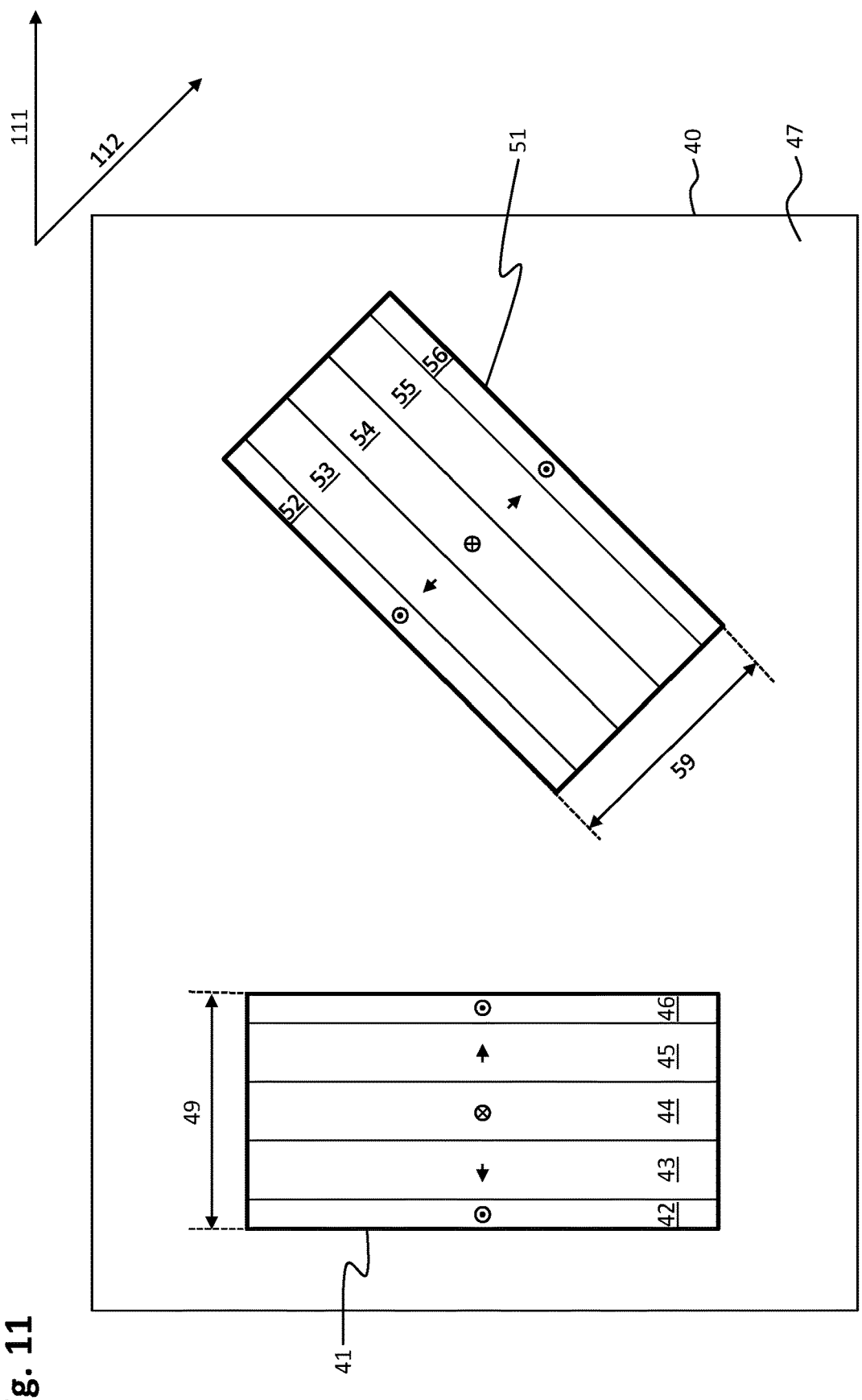
FIG. 11 shows a rotor of a planar-drive system.

FIG. 11 shows a bottom view of a rotor 40 for a planar-drive system. Thus, a planar base surface 47 of the rotor 40 facing a stator module is shown. The rotor 40 has a first magnet unit 41 and a second magnet unit 51. The first magnet unit 41 has five magnet segments 42, 43, 44, 45, 46, the magnet segments 42, 43, 44, 45, 46 being arranged side by side in the first direction 111. During operation of the planar-drive system, the first direction 111 is aligned in parallel to the first direction 111 of one of the sensor modules of the figures shown so far, provided that the rotor 40 is driven in a planar-drive system. Alternatively, the first magnet unit 41 may also be arranged differing by an angle of up to fifteen degrees with regard to the first direction 111. A first magnet segment 42 is arranged next to a second magnet segment 43. A third magnet segment 44 is arranged next to the second magnet segment 43, opposite to the first magnet segment 42. A fourth magnet segment 45 is arranged next to the third magnet segment 44, opposite to the first magnet segment 42 and the second magnet segment 43. Next to the fourth magnet segment 45, opposite to the first magnet segment 42, the second magnet segment 43 and the third magnet segment 44, a fifth magnet segment 46 is arranged. The first magnet segment 42 as well as the fifth magnet segment 46 are magnetized perpendicular to the first direction 111 as well as perpendicular to the planar bottom surface 47 of the rotor 40. A magnetic field resulting therefrom runs through the first magnet segment 42 and the fifth magnet segment 46 out of the drawing plane of FIG. 11. The third magnet segment 44 is magnetized in an antiparallel manner with regard to the first magnet segment 42 or, respectively, the fifth magnet segment 46. A magnetic field resulting therefrom runs through the third magnet segment 44 into the drawing plane of FIG. 11. The first magnet segment 42 and the fifth magnet segment 46 are each half as wide in the first direction 111 as the second magnet segment 43, the third magnet segment 44 and the fourth magnet segment 45.

The second magnet segment 43 is magnetized in an antiparallel manner with regard to the first direction 111. The fourth magnet segment 45 is magnetized in parallel to the first direction 111. The magnetization of the second magnet segment 43 and of the fourth magnet segment 45 is optional. Alternatively, the second magnet segment 43 and the fourth magnet segment 45 may also be non-magnetized or completely omitted.

The first magnet unit 41 may be continued periodically and shows a course of a magnetic field due to the magnetization of the five magnet segments 42, 43, 44, 45, 46. If a further first magnet unit 41 was placed directly adjacent to the first magnet unit 41, the course of the magnetic field would continue periodically. A first periodic length 49 of the first magnet unit 41 corresponds to an extension of the first magnet unit 41 in the first direction 111. The magnetization of the five magnet segments 42, 43, 44, 45, 46 may be rotated in steps of 90 degrees around an axis perpendicular to the first direction 111 and in parallel to the base surface 47, provided that this is done simultaneously for all five magnet segments 42, 43, 44, 45, 46.

The second magnet unit 51 comprises five magnet segments 52, 53, 54, 55, 56, the magnet segments 52, 53, 54, 55, 56 being arranged side by side in the second direction 112. The second direction 112 may thereby be aligned in parallel to the second direction 112 of a sensor module during operation of the planar-drive system, provided that the rotor 40 is driven in a planar-drive system. Alternatively, the second magnet unit 51 may be arranged deviating by an angle of up to fifteen degrees with regard to the second direction 112. The first and second magnet units 41, 51 may also be perpendicular to each other, particularly if the first direction and the second direction of the arrangement of magnetic-field sensors of the sensor module are also perpendicular to each other, as well. Then, in particular the sensor modules of FIGS. 2 to 5 and FIGS. 8 and 9 may be provided for determining the position of the rotor 40. A sixth magnetic segment 52 is arranged next to a seventh magnetic segment 53. An eighth magnet segment 54 is arranged next to the seventh magnet segment 53, opposite to the sixth magnet segment 52. A ninth magnet segment 55 is arranged next to the eighth magnet segment 54, opposite to the sixth magnet segment 52 and the seventh magnet segment 53. Next to the ninth magnet segment 55, opposite to the sixth magnet segment 52, the seventh magnet segment 53 and the eighth magnet segment 54, a tenth magnet segment 56 is arranged. The sixth magnet segment 52 and the tenth magnet segment 56 are in this context magnetized perpendicularly to the second direction 112 and perpendicularly to the planar base surface 47 of the rotor 40. A resulting magnetic field runs out of the drawing plane of FIG. 11 in the sixth magnet segment 52 as well as in the tenth magnet segment 56. The eighth magnet segment 54 is magnetized in an antiparallel manner with regard to the sixth magnet segment 52 or, respectively, to the tenth magnet segment 56. A resulting magnetic field runs into the drawing plane of FIG. 11 in the eighth magnet segment 54. The sixth magnet segment 52 and the tenth magnet segment 56 are each half as wide in the second direction 112 as the seventh magnet segment 53, the eighth magnet segment 54 and the ninth magnet segment 55.

The seventh magnet segment 53 is magnetized in an antiparallel manner with regard to the second direction 112.

The ninth magnet segment 55 is magnetized in parallel to the second direction 112. The magnetization of the seventh magnet segment 53 and the ninth magnet segment 55 is optional. Alternatively, the seventh magnet segment 53 and the ninth magnet segment 55 may also be non-magnetized or completely omitted.

The second magnet unit 51 may be continued periodically in analogy to the first magnet unit 41.

The magnetizations of the five magnet segments 42, 43, 44, 45, 46 of the first magnet unit 41 as well as the five magnet segments 52, 53, 54, 55, 56 of the second magnet unit 51 may be detected by the magnetic-field sensors of one of the described sensor modules and a position of the rotor 40 may be derived therefrom.

The magnetization of the five magnet segments 52, 53, 54, 55, 56 may be rotated in steps of 90 degrees around an axis perpendicular to the second direction 112 and in parallel to the base surface 47, provided that this is done simultaneously for all five magnet net segments 52, 53, 54, 55, 56.

The first and second magnet units 41, 51 of FIG. 11 have a rectangular embodiment. Alternatively, the first and second magnet units 41, 51 may also be in the form of a parallelogram, wherein an angle between parallelogram side s of the first and second magnet units 41, 51 may correspond to an angle between the first direction 111 and the second direction 112.

Figure 12:
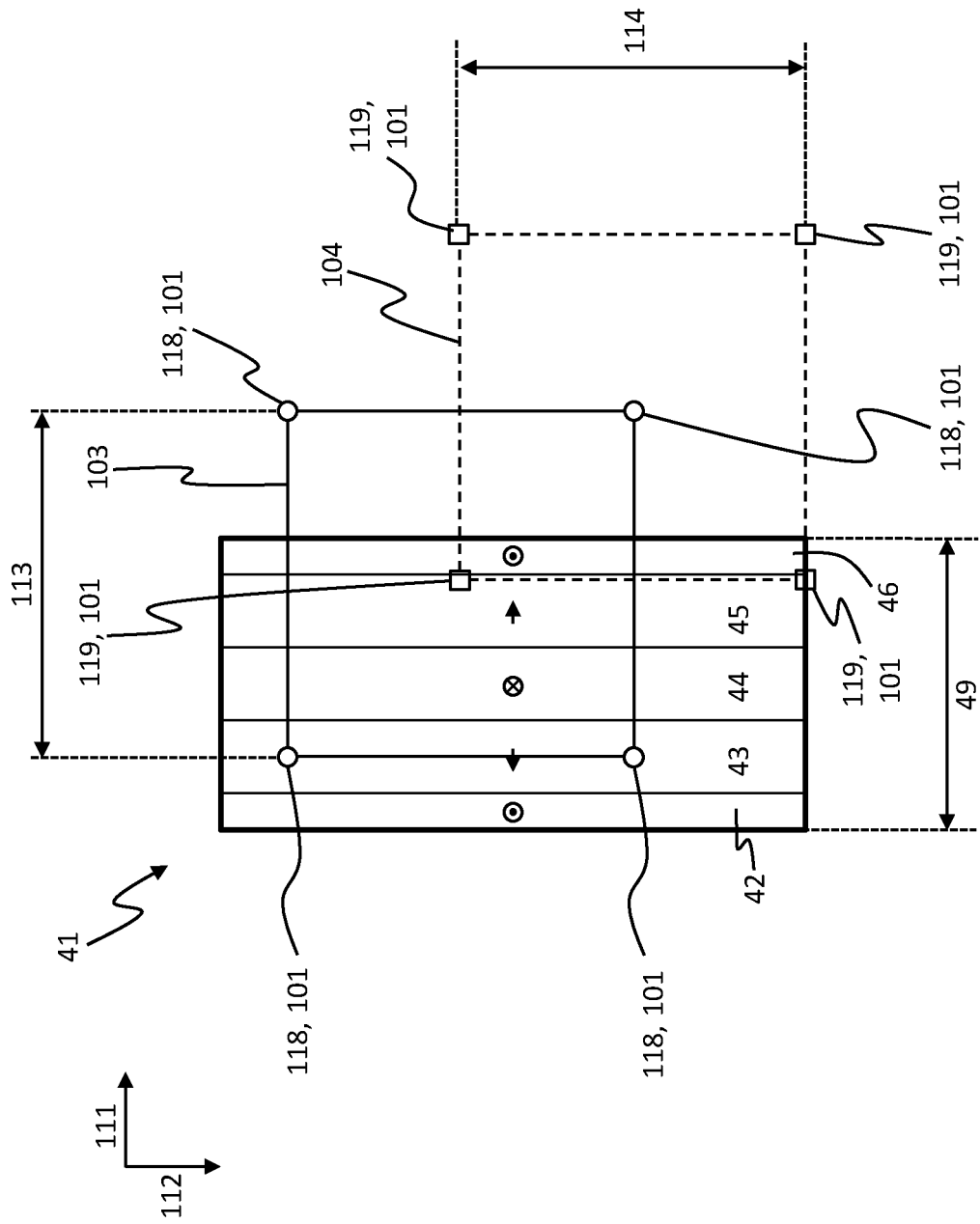
FIG. 12 shows a magnet unit of a rotor.

FIG. 12 shows a schematic representation of a relative position of the first magnet unit 41 comprising the first to fifth magnet segments 42, 43, 44, 45, 46 and a plurality of magnetic-field sensors 101 of a sensor module to illustrate the measuring principle of position detection. The arrangement of the magnetic-field sensors 101 thereby corresponds to one of the arrangements shown in FIG. 4, 5, 8 or 9, in which the second magnetic-field sensors 119 of the second grid 104 are arranged, at least in some areas, centrally between the first magnetic-field sensors 118 of the first grid 103. The first magnetic-field sensors 118 are depicted as being round and the second magnetic-field sensors 119 are depicted as being square. The first distance 113 and the second distance 114 are each six fifths of the first periodic length 49 of the first magnet unit 41. A width of the second magnetic segment 43, the third magnetic segment 44 and the fourth magnetic segment 45 each amounts to one quarter of the first periodic length 49. In FIG. 12, the magnet unit 41 is shown in relation to the first direction 111 in a position above the magnetic-field sensors 101, in which two first magnetic-field sensors 118 of the first grid 103 are arranged centrally below the second magnetic segment 43. A second magnetic-field sensor 119 of the second grid 104 is not arranged centrally below the fourth magnetic segment 45, but slightly shifted in the direction of the fifth magnetic segment 46, due to the width of one quarter of the first periodic length 49 of each of the second, third and fourth magnetic segments 43, 44, 45 and due to the relative distances of the magnetic-field sensors 101 with regard to one another. As a result, the first magnetic-field sensors 118 of the first grid 103 measure a maximum signal in this position for a component arranged in parallel to the first direction 111, while the second magnetic-field sensor 119 of the second grid 104 below the fourth magnetic segment 45 does not measure a maximum signal for this component, but a lower signal. If the rotor and thus the first magnet unit 41 is shifted slightly to the right, the fourth magnetic segment 45 is shifted directly above the second magnetic-field sensor 119 of the second grid 104. At the same time, however, the second magnetic segment 43 shifts further to the right, so that this second magnetic segment 43 is no longer located directly above the first magnetic-field sensors 118 of the first grid 103. Now the second magnetic-field sensor 119 of the second grid 104 measures a maximum signal for the component parallel to the first direction 111, while the first magnetic-field sensors 118 of the first grid 103 measure a lower signal for this component. This results in a good coverage of the values measured for the magnetization of the rotor or, respectively, for the magnet units of the rotor.

A relative arrangement of the magnetic-field sensors 101 of the first grid 103 or, respectively, the second grid 104 and the first magnet unit 41 relative to one another as shown in FIG. 12 allows for detecting the position of the first magnet unit 41 and thus of the rotor in which the first magnet unit 41 is installed. The first magnet unit 41 is thereby aligned in the first direction 111. The second magnet unit of the rotor may be arranged analogously to the first magnet unit 41, but aligned in the second direction 112, and have an analogous coverage of magnetic-field sensors 101 of the first grid 103 or, respectively, of the second grid 104.

Figure 13:
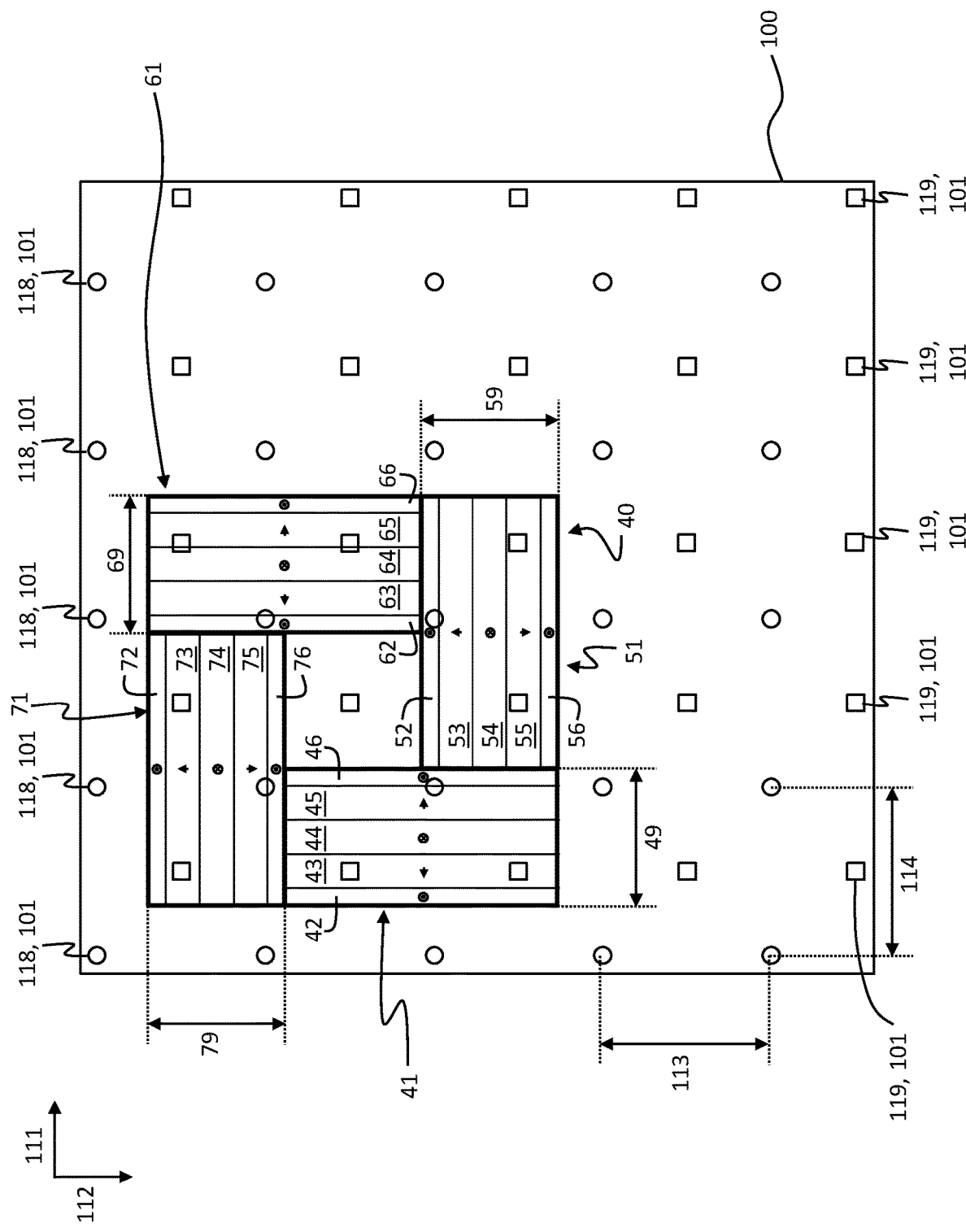
FIG. 13 shows a relative arrangement of magnet units of a rotor relative to magnetic-field sensors of a position-detecting unit in a planar-drive system.

To illustrate the measuring principle of position detection, FIG. 13 shows a schematic arrangement of the magnetic-field sensors 101 comprising the first magnetic-field sensors 118 in a first grid 103 and the second magnetic-field sensors 119 in a second grid 104 of a sensor module 100 relative to a rotor 40, the arrangement of the magnetic-field sensors 101 of the sensor module 100 corresponding to the arrangement of the magnetic-field sensors of FIGS. 4, 5 and 8. The rotor 40 has a first magnet unit 41 and a second magnet unit 51. Furthermore, the rotor 40 has a third magnet unit 61 and a fourth magnet unit 71. The four magnet units 41, 51, 61 and 71 are configured as described for the first magnet unit 41 in connection with FIG. 11. The sensor module 100 may be installed in a stator module, for example in stator module 10 shown in FIGS. 6 to 8. The stator module 10 and the rotor 40 form a planar-drive system in which the rotor 40 may be driven above a stator surface as in the embodiment example shown in FIG. 6 or 10. A position of the rotor 40 may be determined by the sensor module 100.

The four magnet units 41, 51, 61, 71 each consist of five magnet segments, as in FIG. 12. The four magnet units 41, 51, 61, 71 are arranged in a square. The first magnet unit 41 and the third magnet unit 61 are arranged in opposite corners of the rotor 40, the second magnet unit 51 and the fourth magnet unit 71 are also arranged in opposite corners of the rotor 40. The first magnet unit 41 has a first periodic length 49. The second magnet unit 51 has a second periodic length 59. The third magnet unit 61 has a third periodic length 69. The fourth magnet unit 71 has a fourth periodic length 79. The third periodic length 69 may be identical to the first periodic length 49. The fourth periodic length 79 may be identical to the second periodic length 59. The four periodic lengths 49, 59, 69, 79 of the four magnet units 41, 51, 61, 71 each amount to five sixths of the distance between adjacent magnetic-field sensors 101 of the first grid 103 or, respectively, of the second grid 104, as shown e.g. in FIG. 2. However, other values may be provided for the periodic length, as well. The first magnet unit 41 consists of a first magnet segment 42, a second magnet segment 43, a third magnet segment 44, a fourth magnet segment 45 and a fifth magnet segment 46, as shown in FIG. 11. The second magnet unit 51 is composed of a sixth magnet segment 52, a seventh magnet segment 53, an eighth magnet segment 54, a ninth magnet segment 55 and a tenth magnet segment 56, also as in FIG. 11. The third magnet unit 61 is composed of an eleventh magnet segment 62, a twelfth magnet segment 63, a thirteenth magnet segment 64, a fourteenth magnet segment 65 and a fifteenth magnet segment 66. The eleventh to fifteenth magnet segments 62, 63, 64, 65, 66 of the third magnet unit 61 correspond in shape and magnetization to the first to fifth magnet segments 42, 43, 44, 45, 46 of the first magnet unit 41. The fourth magnet unit 71 consists of a sixteenth magnet segment 72, a seventeenth magnet segment 73, an eighteenth magnet segment 74, a nineteenth magnet segment 75 and a twentieth magnet segment 76. The sixteenth to twentieth magnet segments 72, 73, 74, 75, 76 of the fourth magnet unit 71 correspond in form and magnetization to the sixth to tenth magnet segments 52, 53, 54, 55, 56 of the second magnet unit 51. The magnetization of the magnet segments 42, 43, 44, 45, 46, 62, 63, 64, 65, 66 of the first magnet unit 41 or, respectively, of the third magnet unit 61 may be rotated in steps of 90 degrees around an axis perpendicular to the first direction 111 and in parallel to the base surface 47, provided that this is done simultaneously for all magnet segments 42, 43, 44, 45, 46, 62, 63, 64, 65, 66. The magnetization of the magnet segments 52, 53, 54, 55, 56, 72, 73, 74, 75, 76 of the second magnet unit 51 and the fourth magnet unit 71 may be rotated in steps of 90 degrees around an axis perpendicular to the second direction 112 and parallel to the floor surface 47, provided that this is done simultaneously for all five magnet segments 52, 53, 54, 55, 56, 72, 73, 74, 75, 76.

The position of the rotor 40 shown in FIG. 13 is such that three magnetic-field sensors 101 are arranged below each of the four magnet units 41, 51, 61, 71. Due to a movement of the rotor 40, it may happen that two or four magnetic-field sensors 101 are arranged below one of the four magnet units 41, 51, 61, 71. In the position of the rotor shown herein, two second magnetic-field sensors 119 of the second grid 104 are arranged centrally below the second magnetic segment 43. A first magnetic-field sensor 118 of the first grid 103 is arranged below the fourth magnetic segment 45, but is not arranged centrally below the fourth magnetic segment 45, but shifted in the direction of the fifth magnetic segment 46. A first magnetic-field sensor 118 of the first grid 103 is located below the eleventh magnet segment 62. Two second magnetic-field sensors 119 of the second grid 104 are located below a boundary between the thirteenth magnetic segment 64 and the fourteenth magnetic segment 65. If the rotor 40 is now shifted to the right, i.e. in the first direction 111, the magnetic-field sensors 101 below the first magnet unit 41 and the third magnet unit 61 are shifted in such a way that magnetic-field sensors 101 regularly move centrally below the individual magnetic segments 42, 43, 44, 45, 46, 62, 63, 64, 65, 66 of the first and third magnet unit 41, 61 and other magnetic-field sensors 101 are not arranged centrally below the individual magnetic segments 42, 43, 44, 45, 46, 62, 63, 64, 65, 66 of the first and third magnet unit 41, 61. As a result, the position of the rotor 40 in the first direction 111 may be well determined, since a good position detection is possible from a relation of the measured values of the magnetic-field sensors 101 centrally below the individual magnetic segments 42, 43, 44, 45, 46, 62, 63, 64, 65, 66 of the first and third magnet unit 41, 61 and not centrally below the individual magnetic segments 42, 43, 44, 45, 46, 62, 63, 64, 65, 66 of the first and third magnet unit 41, 61.

Two second magnetic-field sensors 119 of the second grid 104 are also arranged centrally below the seventeenth magnet segment 73. A first magnetic-field sensor 118 of the first grid 103 is located below a boundary between the nineteenth magnetic segment 75 and the twentieth magnetic segment 76. A first magnetic-field sensor 118 of the first grid 103 is arranged below the sixth magnetic segment 52. Two second magnetic-field sensors 119 of the second grid 104 are arranged the ninth magnet segment 55, however, not centrally centered below the ninth magnet segment 55, but shifted in the direction of the eighth magnet segment 54. If the rotor 40 is now moved downwards, i.e. in the second direction 112, the magnetic-field sensors 101 below the second magnet unit 51 and the fourth magnet unit 71 are shifted in such a way that magnetic-field sensors 101 are regularly arranged centrally below the respective magnetic segments 52, 53, 54, 55, 56, 72, 73, 74, 75, 76 of the second and fourth magnet unit 51, 71 and other magnetic-field sensors 101 are not arranged centrally below the respective magnetic segments 52, 53, 54, 55, 56, 72, 73, 74, 75, 76 of the second and fourth magnet unit 51, 71. The position of the rotor 40 in the second direction 112 may thus be well determined, since a good position detection is possible from a relation of the measured values of the magnetic-field sensors 101 centrally below the respective magnetic segments 52, 53, 54, 55, 56, 72, 73, 74, 75, 76 of the second and fourth magnet unit 51, 71 and not centrally below the respective magnetic segments 52, 53, 54, 55, 56, 72, 73, 74, 75, 76 of the second and fourth magnet unit 51, 71.

In order to improve position detection, it is thus provided that in a first position of the rotor 40 some magnetic-field sensors 101 are arranged centrally below some of the magnetic segments 42, 43, 44, 45, 46, 52, 53, 54, 55, 56, 62, 63, 64, 65, 66, 72, 73, 74, 75, 76, while other magnetic-field sensors are located at other positions, in particular at positions between the positions arranged centrally below the magnetic segments 42, 43, 44, 45, 46, 52, 53, 54, 55, 56, 62, 63, 64, 65, 66, 72, 73, 74, 75, 76. Due to small shifts of the rotor 40, the magnetic-field sensors 101, which in the first position of the rotor 40, were located centrally below the magnetic segments 42, 43, 44, 45, 46, 52, 53, 54, 55, 56, 62, 63, 64, 65, 66, 72, 73, 74, 75, 76, are no longer positioned centrally under these magnet segments 42, 43, 44, 45, 46, 52, 53, 54, 55, 56, 62, 63, 64, 65, 66, 72, 73, 74, 75, 76. Instead, other magnetic net field sensors 101 are now arranged centrally below other magnetic segments 42, 43, 44, 45, 46, 52, 53, 54, 55, 56, 62, 63, 64, 65, 66, 72, 73, 74, 75, 76. This is in particular possible if the first periodic length 49 and the second periodic length 59 are not integral multiples of the first distance 113 or the second distance 114, but are in a rational relationship to the first distance 113 or the second distance 114.

A distance between the first magnet unit 41 and the third magnet unit 61 may correspond to the first periodic length 49. A distance between the second magnet unit 51 and the fourth magnet unit 71 may correspond to the second periodic length 59.

The first magnet unit 41 is adjacent to the second magnet unit 51 and the fourth magnet unit 71. The second magnet unit 51 is adjacent to the first magnet unit 41 and the third magnet unit 61. The third magnet unit 61 is adjacent to the second magnet unit 51 and the fourth magnet unit 71. The fourth magnet unit 71 is adjacent to the first magnet unit 41 and the third magnet unit 61.

Figure 14:
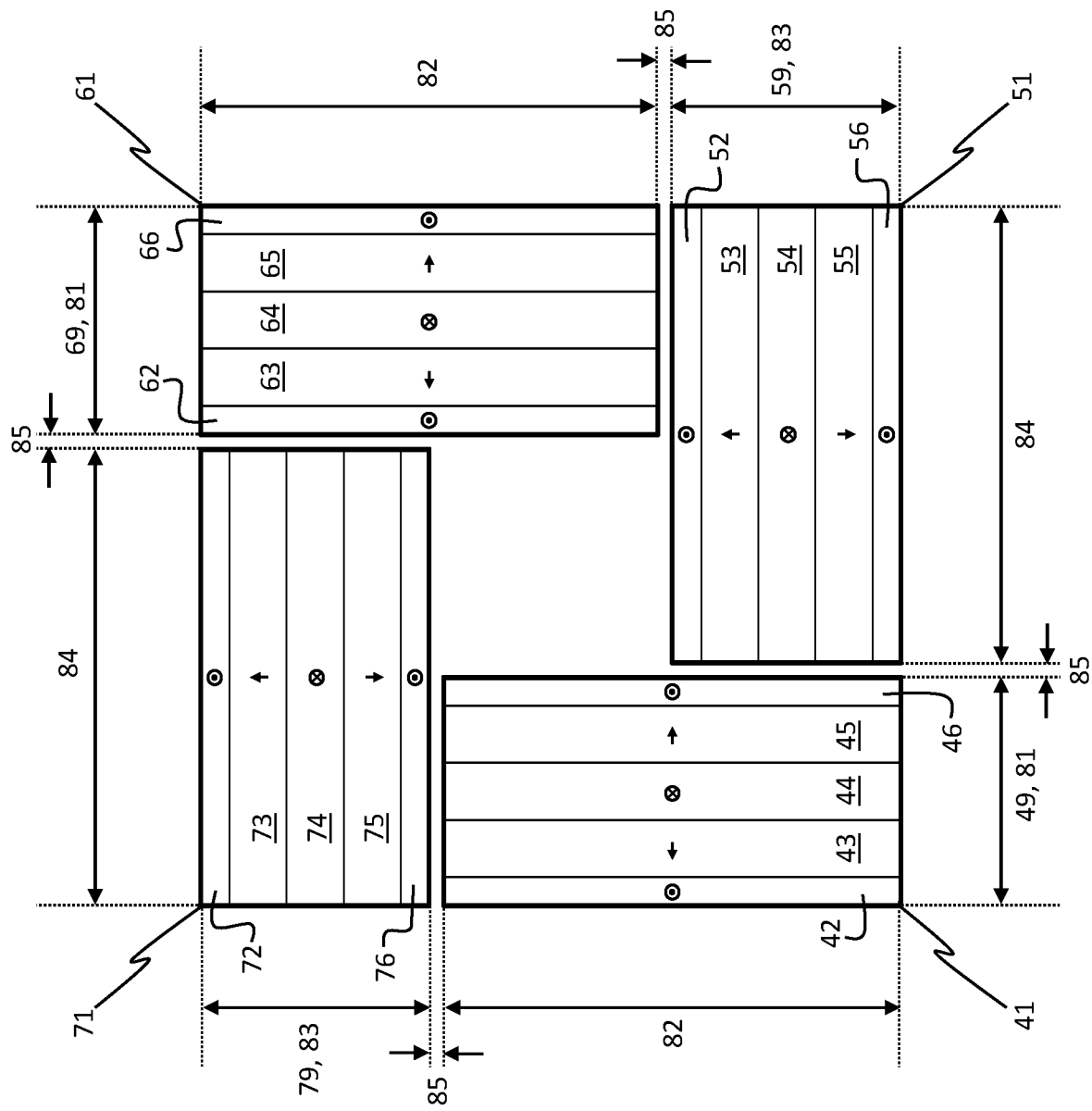
FIG. 14 shows a further embodiment example of a rotor.

Alternatively, the four magnet units 41, 51, 61, 71 may be arranged as shown in FIG. 14. Between the four magnet units 41, 51, 61, 71, distances 85 are provided which are one twelfth of the first, second, third or fourth periodic length 49, 59, 69, 79. The four magnet units 41, 51, 61, 71 are made up of individual magnet segments 42, 43, 44, 45, 46, 52, 53, 54, 55, 56, 62, 63, 64, 65, 66, 72, 73, 74, 75, 76 as shown in FIG. 12. The first magnet unit 41 comprises a first extension 81 which corresponds to the first periodic length 49 of the first magnet unit 41. The first magnet unit 41 has a rectangular embodiment and a second dimension 82 is the double of the second periodic length 59 of the second magnet unit 51. The second magnet unit 51 has a third dimension 83 which corresponds to the second periodic length 59. A fourth extension 84 of the second magnet unit 51, which is also rectangular, has twice the first periodic length 49 of the first magnet unit 41. The third magnet unit 61 comprises the first extension 81 and the second extension 82 in analogy to the first magnet unit 41. The fourth magnet unit 71 comprises the third extension 83 and the fourth extension 84 in analogy to the second magnet unit 51. Such a rotor may also be well determined by the position-detecting system of the stator module.

The rotor 40 of FIG. 13 may also have the four expansions 81, 82, 83, 84 of the four magnet units 41, 51, 61, 71, as shown in FIG. 14.

It may be provided that the planar-drive system is supplemented by further stator modules adjacent to the stator module corresponding to FIG. 9 and by further rotors. By arranging the magnetic-field sensors 101 in the stator module in such a way that the arrangement of the magnetic-field sensors 101 continues periodically when further stator modules are provided, a good position detection of the rotor 40 may also be achieved across several stator modules. The position of several rotors may also be easily determined.

The examples shown may be combined with each other without exceeding the protective scope of the invention.

TABLE 1

| Reference Character List |
|---|
| 1 planar-drive system |
| 10 stator module |
| 11 stator surface |
| 12 stator-module housing |
| 14 stator assembly |
| 15 side faces |
| 16 conductor strips |
| 17 conductor-strip gap |
| 20 stator module |
| 21 first side |
| 22 second side |
| 23 third side |
| 24 fourth side |
| 25 first corner area |
| 26 second corner area |
| 27 sectional plane |
| 28 first vertical projection |
| 29 second vertical projection |
| 30 third vertical projection |
| 31 fourth vertical projection |
| 32 power module |
| 33 bottom side |
| 34 heat-conducting element |
| 35 fan |
| 36 marginal area |
| 37 central area |
| 40 rotor |
| 41 first magnet unit |
| 42 first magnet segment |
| 43 second magnet segment |
| 44 third magnet segment |
| 45 fourth magnet segment |
| 46 fifth magnet segment |
| 47 planar base surface |
| 49 first periodic length |
| 51 second magnet unit |
| 52 sixth magnet segment |
| 53 seventh magnet segment |
| 54 eighth magnet segment |
| 55 ninth magnet segment |
| 56 tenth magnet segment |
| 59 second periodic length |
| 61 third magnet unit |
| 62 eleventh magnet segment |
| 63 twelfth magnet segment |

TABLE 1-continued

| Reference Character List |
|---|
| 64 thirteenth magnet segment |
| 65 fourteenth magnet segment |
| 66 fifteenth magnet segment |
| 69 third periodic length |
| 71 fourth magnet unit |
| 72 sixteenth magnet segment |
| 73 seventeenth magnet segment |
| 74 eighteenth magnet segment |
| 75 nineteenth magnet segment |
| 76 twentieth magnet segment |
| 79 fourth periodic length |
| 81 first side edge |
| 82 second side edge |
| 83 third side edge |
| 85 distance |
| 100 sensor module |
| 101 magnetic-field sensors |
| 102 carrier |
| 103 first periodic grid |
| 104 second periodic grid |
| 105 center |
| 106 alignment hole |
| 107 outer area |
| 108 inner area |
| 109 slit-shaped widening |
| 110 additional through-hole |
| 111 first direction |
| 112 second direction |
| 113 first distance |
| 114 second distance |
| 115 columns |
| 116 rows |
| 118 first magnetic-field sensor |
| 119 second magnetic-field sensor |
| 120 vector |
| 121 first component |
| 122 second component |
| 125 first sub-arrangement |
| 126 second sub-arrangement |
| 130 through-opening |
| 131 first diagonal |
| 132 second diagonal |
| 135 web |
| 136 first side |
| 137 second side |
| 138 third side |
| 139 fourth side |
| 141 first corner magnetic-field sensor |
| 142 second corner magnetic-field sensor |
| 143 first vector |
| 144 second vector |
| 145 third vector |
| 146 fourth vector |
| 151 1st column of first grid |
| 152 2nd column of first grid |
| 153 1st row of first grid |
| 154 2nd row of first grid |
| 155 4th column of second grid |
| 156 5th column of second grid |
| 157 4th row of second grid |
| 158 5th row of second grid |

The invention claimed is:

1. A planar-drive system, comprising:
a rotor, and
a stator module, wherein the stator module comprises a stator-module housing, a stator assembly for electrically driving the rotor and a sensor module for detecting a position of the rotor;
wherein the rotor is configured to be driven over a planar stator surface of the stator assembly at least in a first direction and in a second direction,
wherein the sensor module comprises a carrier and a two-dimensional arrangement of magnetic-field sensors, wherein the magnetic-field sensors are arranged on the carrier,
wherein the two-dimensional arrangement of magnetic-field sensors comprises a first sub-arrangement of first magnetic-field sensors,
wherein the first magnetic-field sensors of the first sub-arrangement are arranged in a first periodic grid,
wherein the first magnetic-field sensors are arranged in the first periodic grid along the first direction and along the second direction,
wherein adjacent first magnetic-field sensors of the first sub-arrangement are arranged at a first distance with regard to one another in the first direction,
wherein adjacent first magnetic-field sensors of the first sub-arrangement are arranged at a second distance with regard to one another in the second direction,
wherein the two-dimensional arrangement of magnetic-field sensors comprises a second sub-arrangement of second magnetic-field sensors,
wherein the second magnetic-field sensors of the second sub-arrangement are arranged in a second periodic grid,
wherein the second magnetic-field sensors are arranged in the second periodic grid along the first direction and along the second direction,
wherein adjacent second magnetic-field sensors of the second sub-arrangement are arranged at a first distance with regard to one another in the first direction,
wherein adjacent second magnetic-field sensors of the second sub-arrangement are arranged at a second distance with regard to one another in the second direction,
wherein the first sub-arrangement and the second sub-arrangement are arranged shifted relative to one another by a vector,
wherein the vector has a first component in the first direction and a second component in the second direction,
wherein the first component is smaller than the first distance, wherein the second component is smaller than the second distance,
wherein the rotor comprises a first magnet unit, wherein the first magnet unit comprises a first periodic arrangement of magnets having a first periodic length,
wherein the first periodic arrangement of magnets is periodic in the first direction,
wherein the first magnet unit is oriented in the first direction during operation of the planar-drive system,
wherein the rotor comprises a second magnet unit, wherein the second magnet unit comprises a second periodic arrangement of magnets having a second periodic length,
wherein the second periodic arrangement of magnets is periodic in the second direction,
wherein the second magnet unit is oriented in the second direction during operation of the planar-drive system,
wherein the first component is smaller than the first periodic length,
wherein a difference between the first distance and the first component is smaller than the first periodic length,
wherein the second component is smaller than the second periodic length, and
wherein a difference between the second distance and the second component is smaller than the second periodic length.

2. The planar-drive system according to claim 1,
wherein the stator assembly is arranged on an upper side of the stator-module housing,
wherein the carrier is arranged below the stator assembly in the stator-module housing,
wherein the carrier has a through-opening,
wherein the stator-module housing comprises a heat-conducting structure,
wherein the heat-conducting structure is embodied to dissipate heat from the stator assembly to a bottom side of the stator-module housing opposite to the stator surface,
wherein the heat-conducting structure is guided from the stator assembly to the bottom side of the stator-module housing via the through-opening,
wherein the through-opening adjoins four magnetic-field sensors,
wherein two first magnetic-field sensors thereof are assigned to the first sub-arrangement and two second magnetic-field sensors thereof are assigned to the second sub-arrangement.

3. The planar-drive system according to claim 1, wherein the first periodic length is a product of a first rational number and the first distance, wherein the second periodic length is a product of a second rational number and the second distance, and wherein the first rational number and the second rational number are between 0.5 and 1.

4. The planar-drive system according to claim 3, wherein the first rational number is five sixths and wherein the second rational number is five sixths.

5. The planar-drive system according to claim 1, wherein the first component corresponds to half of the first distance and wherein the second component corresponds to half of the second distance.

6. The planar-drive system according to claim 1, wherein the first distance and the second distance are equal.

7. The planar-drive system according to claim 1 wherein the first direction and the second direction are perpendicular with regard to each other.

8. The planar-drive system according to claim 1,
wherein the stator surface is a parallelogram,
wherein a length of a first parallelogram side of the stator surface is a first integral multiple of the first distance,
wherein a length of a second parallelogram side of the stator surface is a second integer multiple of the second distance,
wherein the first parallelogram side is oriented in parallel to the first direction, and
wherein the second parallelogram side is oriented in parallel to the second direction.

9. The planar-drive system according to claim 8, wherein the stator surface is rectangular, in particular square.

10. The planar-drive system according to claim 8, wherein the first integer multiple and the second integer multiple are identical.

11. The planar-drive system according to claim 8,
wherein the carrier is arranged in such a way that a first corner magnetic-field sensor of the first sub-arrangement is arranged below a first corner region of the stator surface,
wherein the first corner region of the stator surface is arranged at a point of intersection of a first parallelogram side and a second parallelogram side,
wherein the first corner magnetic-field sensor is in the first direction positioned at a quarter of the first distance from the second parallelogram side of the stator surface, wherein the first corner magnetic-field sensor is placed in the second direction positioned at a quarter of the second distance from the first parallelogram side of the stator surface, wherein a second corner magnetic-field sensor of the second sub-arrangement is arranged in a second corner region of the stator surface opposite to the first corner region, wherein the second corner region of the stator surface is arranged at an intersection of a third parallelogram side and a fourth parallelogram side, wherein the second corner magnetic-field sensor is in the first direction positioned at a quarter of the first distance from the fourth parallelogram side of the stator surface, wherein the fourth parallelogram side is opposite to the second parallelogram side, wherein the second corner magnetic-field sensor is in the second direction positioned at a quarter of the second distance from the third parallelogram side of the stator surface, and wherein the third parallelogram side is opposite to the first parallelogram side.

12. A stator module for a planar-drive system, comprising:
a stator-module housing,
a stator assembly for electrically driving a rotor, and
a sensor module for detecting a position of the rotor,
wherein the rotor is drivable over a planar stator surface of the stator assembly at least in a first direction and a second direction,
wherein the sensor module comprises a carrier and a two-dimensional arrangement of magnetic-field sensors,
wherein the magnetic-field sensors are arranged on the carrier, wherein the two-dimensional arrangement of magnetic-field sensors comprises a first sub-arrangement of first magnetic-field sensors,
wherein the first magnetic-field sensors of the first sub-arrangement are arranged in a first periodic grid,
wherein the first magnetic-field sensors are arranged in the first periodic grid along the first direction and along the second direction,
wherein adjacent first magnetic-field sensors of the first sub-arrangement are arranged in the first direction at a first distance with regard to one another,
wherein adjacent first magnetic-field sensors of the first sub-arrangement are arranged at a second distance from each other in the second direction,
wherein the two-dimensional arrangement of magnetic-field sensors comprises a second sub-arrangement of second magnetic-field sensors,
wherein the second magnetic-field sensors of the second sub-arrangement is arranged in a second periodic grid,
wherein the second magnetic-field sensors is arranged in the second periodic grid along the first direction and along the second direction,
wherein adjacent second magnetic-field sensors of the second sub-arrangement are arranged at a first distance from one another in the first direction,
wherein adjacent second magnetic-field sensors of the second sub-arrangement are arranged at a second distance from one another in the second direction,
wherein the first sub-arrangement and the second sub-arrangement are arranged shifted relative to each other by a vector,
wherein the vector comprises a first component in the first direction and a second component in the second direction, and wherein the first component is smaller than the first distance and wherein the second component is smaller than the second distance.

13. The stator module according to claim 12, wherein the magnetic-field sensors comprise Hall sensors and in particular 2D or 3D Hall sensors.

14. The stator module according to claim 12, wherein the carrier comprises a circuit board, in particular a printed-circuit board.

15. The stator module according to claim 12,
wherein the stator assembly is arranged on an upper side of the stator-module housing,
wherein the carrier is arranged below the stator assembly in the stator-module housing,
wherein the carrier has a through-opening,
wherein the stator-module housing comprises a heat-conducting structure,
wherein the heat-conducting structure is embodied to dissipate heat from the stator assembly to a bottom side of the stator-module housing opposite to the stator surface,
wherein the heat-conducting structure is guided from the stator assembly to the bottom side of the stator-module housing via the through-opening,
wherein the through-opening adjoins four magnetic-field sensors, and
wherein two first magnetic-field sensors thereof are assigned to the first sub-arrangement and two second magnetic-field sensors thereof are assigned to the second sub-arrangement.

16. The stator module according to claim 15,
wherein the carrier has a plurality of through openings and a plurality of heat-conducting elements guided through the through openings,
wherein the through openings each adjoin four magnetic-field sensors, and
wherein two first magnetic-field sensors thereof are assigned to the first sub-arrangement and two second magnetic-field sensors thereof are assigned to the second sub-arrangement.

17. The stator module according to claim 15,
wherein the carrier has an inner region and an outer region,
wherein the outer region is arranged annularly around the inner region,
wherein the through-opening or the through-openings are arranged in the outer region, and
wherein the outer region comprises at least 50 percent of an area of the sensor module.

18. The stator module according to claim 12, wherein the arrangement of magnetic-field sensors comprises exactly two sub-arrangements of magnetic-field sensors.

19. A sensor module for detecting a position of a rotor in a planar-drive system,
wherein the sensor module comprises a carrier and a two-dimensional arrangement of magnetic-field sensors,
wherein the magnetic-field sensors are arranged on the carrier,
wherein the two-dimensional arrangement of magnetic-field sensors comprises a first sub-arrangement of first magnetic-field sensors,
wherein the first magnetic-field sensors of the first sub-arrangement are arranged in a first periodic grid,
wherein the first magnetic-field sensors are arranged in the first periodic grid in a first direction and in a second direction, wherein adjacent first magnetic-field sensors of the first sub-arrangement are arranged at a first distance with regard to one another along the first direction, wherein adjacent first magnetic-field sensors of the first sub-arrangement are arranged at a second distance with regard to one another along the second direction, wherein the two-dimensional arrangement of magnetic-field sensors comprises a second sub-arrangement of second magnetic-field sensors, wherein the second magnetic-field sensors of the second sub-arrangement are arranged in a second periodic grid, wherein the second magnetic-field sensors are arranged in the second periodic grid in the first direction and in the second direction, wherein adjacent second magnetic-field sensors of the second sub-arrangement are arranged at a first distance with regard to each other along the first direction, wherein adjacent second magnetic-field sensors of the second sub-arrangement are arranged at a second distance from each other along the second direction, wherein the first sub-arrangement and the second sub-arrangement are arranged shifted relative to each other by a vector, wherein the vector has a first component in the first direction and a second component in the second direction, and wherein the first component is smaller than the first distance, and wherein the second component is smaller than the second distance.

20. The sensor module according to claim 19, wherein the carrier has a through-opening for a heat-conducting structure, wherein the through-opening adjoins four magnetic-field sensors, and wherein two first magnetic-field sensors thereof are assigned to the first sub-arrangement and two second magnetic-field sensors thereof are assigned to the second sub-arrangement.

* * * * *